US006697979B1

(12) United States Patent
Vorbach et al.

(10) Patent No.: US 6,697,979 B1
(45) Date of Patent: Feb. 24, 2004

(54) METHOD OF REPAIRING INTEGRATED CIRCUITS

(75) Inventors: Martin Vorbach, Karlsruhe (DE); Robert Münch, Karlsruhe (DE)

(73) Assignee: Pact XPP Technologies AG, Munich (DE)

( * ) Notice: Subject to any disclaimer, the term of this patent is extended or adjusted under 35 U.S.C. 154(b) by 288 days.

(21) Appl. No.: 09/598,926

(22) Filed: Jun. 21, 2000

Related U.S. Application Data

(63) Continuation of application No. PCT/DE98/03682, filed on Dec. 15, 1998.

(30) Foreign Application Priority Data

Dec. 22, 1997 (DE) .......................................... 197 57 200

(51) Int. Cl.[7] .............................................. G01R 31/28
(52) U.S. Cl. ........................ 714/724; 714/10; 714/733
(58) Field of Search .............................. 714/10, 5, 732, 714/733, 724; 712/10, 2

(56) References Cited

U.S. PATENT DOCUMENTS

| | | | |
|---|---|---|---|
| 3,681,578 A | * | 8/1972 | Stevens .................... 714/11 |
| 4,498,172 A | * | 2/1985 | Bhavsar .................... 714/32 |
| 4,566,102 A | * | 1/1986 | Hefner ....................... 714/7 |
| 4,591,979 A | | 5/1986 | Iwashita |
| 4,706,216 A | | 11/1987 | Carter |
| 4,739,474 A | | 4/1988 | Holsztynski |
| 4,761,755 A | | 8/1988 | Ardini et al. |
| 4,811,214 A | | 3/1989 | Nosenchuck et al. |
| 4,852,048 A | | 7/1989 | Moton |
| 4,870,302 A | | 9/1989 | Freeman |
| 4,891,810 A | * | 1/1990 | de Corlieu et al. ........... 714/11 |
| 4,901,268 A | | 2/1990 | Judd |
| 4,967,340 A | | 10/1990 | Dawes |
| 5,014,193 A | | 5/1991 | Garner et al. |
| 5,015,884 A | | 5/1991 | Agrawal et al. |
| 5,021,947 A | | 6/1991 | Campbell et al. |
| 5,023,775 A | | 6/1991 | Poret |
| 5,029,166 A | | 7/1991 | Jarwaia et al. |
| 5,043,978 A | | 8/1991 | Nagler et al. |
| 5,081,375 A | | 1/1992 | Pickett et al. |
| 5,109,503 A | | 4/1992 | Cruickshank et al. |
| 5,113,498 A | | 5/1992 | Evan et al. |
| 5,115,510 A | | 5/1992 | Okamoto et al. |
| 5,123,109 A | | 6/1992 | Hillis |
| 5,125,801 A | | 6/1992 | Nabity et al. |
| 5,128,559 A | | 7/1992 | Steele |
| 5,142,469 A | | 8/1992 | Weisenborn |

(List continued on next page.)

FOREIGN PATENT DOCUMENTS

| | | |
|---|---|---|
| DE | 19651075.9 | 12/1996 |
| EP | 0477809 A | 4/1992 |

OTHER PUBLICATIONS

"TMS320C54x DSP: CPU and Peripherials", Texas Instruments, 1996, pp. 6–26 to 6–46.*
"TMS320C54x DSP: Mnemonic Instruction Set", Texas Instruments, 1996, p. 4–64.*

Primary Examiner—Albert Decady
Assistant Examiner—Guy Lamarre
(74) Attorney, Agent, or Firm—Kenyon & Kenyon

(57) ABSTRACT

An arrangement and a method are provided for replacing defective units, which can be any desired unit of a chip (e.g., arithmetic and logic units), with a function unit. The arrangement and the method provide for performing self-tests more easily, less expensively and before or during a running of an application program. Fault tolerance is greatly enhanced during operation, which is advantageous for failure-critical applications such as in power plants, aviation, space travel or the military, for example.

17 Claims, 18 Drawing Sheets

U.S. PATENT DOCUMENTS

| | | |
|---|---|---|
| 5,204,935 A | 4/1993 | Mihara et al. |
| 5,208,491 A | 5/1993 | Ebeling et al. |
| 5,226,122 A | 7/1993 | Thayer et al. |
| RE34,363 E | 8/1993 | Freeman |
| 5,233,539 A | 8/1993 | Agrawal et al. |
| 5,247,689 A | 9/1993 | Ewert |
| 5,274,593 A * | 12/1993 | Proebsting .................. 365/200 |
| 5,287,472 A | 2/1994 | Horst |
| 5,301,284 A | 4/1994 | Estes et al. |
| 5,301,344 A | 4/1994 | Kolchinsky |
| 5,303,172 A | 4/1994 | Magar et al. |
| 5,336,950 A | 8/1994 | Popli et al. |
| 5,347,639 A | 9/1994 | Rechtschaffen et al. |
| 5,361,373 A | 11/1994 | Gilson |
| 5,400,538 A * | 3/1995 | Shannon .................... 42/70.07 |
| 5,410,723 A | 4/1995 | Schmidt et al. |
| 5,418,952 A | 5/1995 | Morley et al. |
| 5,421,019 A | 5/1995 | Holsztynski et al. |
| 5,422,823 A | 6/1995 | Agrawal et al. |
| 5,426,378 A | 6/1995 | Ong |
| 5,428,768 A * | 6/1995 | Sugahara .................... 714/10 |
| 5,430,687 A | 7/1995 | Hung et al. |
| 5,440,245 A | 8/1995 | Galbraith et al. |
| 5,440,538 A * | 8/1995 | Olsen ........................ 370/228 |
| 5,442,790 A | 8/1995 | Nosenchuck |
| 5,444,394 A | 8/1995 | Watson et al. |
| 5,448,186 A | 9/1995 | Kawata |
| 5,455,525 A | 10/1995 | Ho et al. |
| 5,457,644 A | 10/1995 | McCollum |
| 5,465,375 A | 11/1995 | Thepaut et al. |
| 5,473,266 A | 12/1995 | Ahanin et al. |
| 5,473,267 A | 12/1995 | Stansfield |
| 5,475,583 A | 12/1995 | Bock et al. |
| 5,475,803 A | 12/1995 | Stearns et al. |
| 5,475,856 A | 12/1995 | Kogge |
| 5,483,620 A | 1/1996 | Pechanek et al. |
| 5,485,103 A | 1/1996 | Pedersen et al. |
| 5,485,104 A | 1/1996 | Agrawal et al. |
| 5,489,857 A | 2/1996 | Agrawal et al. |
| 5,491,353 A | 2/1996 | Kean |
| 5,493,239 A | 2/1996 | Zlotnick |
| 5,497,498 A | 3/1996 | Taylor |
| 5,506,998 A | 4/1996 | Kato et al. |
| 5,510,730 A | 4/1996 | El Gamal et al. |
| 5,511,173 A | 4/1996 | Yamaura et al. |
| 5,513,366 A | 4/1996 | Agarwal et al. |
| 5,521,837 A | 5/1996 | Frankle et al. |
| 5,522,083 A | 5/1996 | Gove et al. |
| 5,530,873 A * | 6/1996 | Takano ........................ 710/260 |
| 5,530,946 A * | 6/1996 | Bouvier et al. ............... 714/23 |
| 5,532,693 A | 7/1996 | Winters et al. |
| 5,532,957 A | 7/1996 | Malhi |
| 5,535,406 A | 7/1996 | Kolchinsky |
| 5,537,057 A | 7/1996 | Leong et al. |
| 5,537,601 A | 7/1996 | Kimura et al. |
| 5,541,530 A | 7/1996 | Cliff et al. |
| 5,544,336 A | 8/1996 | Kato et al. |
| 5,548,773 A | 8/1996 | Kemeny et al. |
| 5,555,434 A | 9/1996 | Carlstedt |
| 5,559,450 A | 9/1996 | Ngai et al. |
| 5,561,738 A | 10/1996 | Kinerk et al. |
| 5,570,040 A | 10/1996 | Lytle et al. |
| 5,583,450 A | 12/1996 | Trimberger et al. |
| 5,586,044 A | 12/1996 | Agrawal et al. |
| 5,587,921 A | 12/1996 | Agrawal et al. |
| 5,588,152 A | 12/1996 | Dapp et al. |
| 5,590,345 A | 12/1996 | Barker et al. |
| 5,595,907 A | 1/1997 | Barker et al. |
| 5,596,742 A | 1/1997 | Agarwal et al. |
| 5,617,547 A | 4/1997 | Feeney et al. |
| 5,634,131 A | 5/1997 | Matter et al. |
| 5,652,894 A | 7/1997 | Hu et al. |
| 5,655,069 A * | 8/1997 | Ogawara et al. .............. 714/10 |
| 5,655,124 A | 8/1997 | Lin |
| 5,657,330 A * | 8/1997 | Matsumoto ................. 714/733 |
| 5,659,797 A | 8/1997 | Zandveld et al. |
| 5,713,037 A | 1/1998 | Wilkinson et al. |
| 5,717,943 A | 2/1998 | Barker et al. |
| 5,732,209 A * | 3/1998 | Vigil et al. ................... 714/30 |
| 5,734,921 A | 3/1998 | Dapp et al. |
| 5,742,180 A | 4/1998 | Detton |
| 5,748,872 A | 5/1998 | Norman |
| 5,754,871 A | 5/1998 | Wilkinson et al. |
| 5,761,484 A | 6/1998 | Agarwal et al. |
| 5,778,439 A | 7/1998 | Timberger et al. |
| 5,794,059 A | 8/1998 | Barker et al. |
| 5,801,715 A | 9/1998 | Norman |
| 5,828,858 A | 10/1998 | Athanas |
| 5,838,165 A | 11/1998 | Chatter |
| 5,844,888 A | 12/1998 | Narjjuyka |
| 5,848,238 A * | 12/1998 | Shimomura et al. .......... 714/49 |
| 5,867,691 A | 2/1999 | Shiraishi |
| 5,892,961 A | 4/1999 | Trimberger et al. |
| 5,901,279 A * | 5/1999 | Davis, III ...................... 714/3 |
| 5,915,123 A | 6/1999 | Mirsky et al. |
| 5,927,423 A | 7/1999 | Wada et al. |
| 5,936,424 A | 8/1999 | Young et al. |
| 5,956,518 A | 9/1999 | DeHon et al. |
| 6,014,509 A | 1/2000 | Furtek et al. |
| 6,034,538 A | 3/2000 | Abramovici |
| 6,052,773 A | 4/2000 | DeHon et al. |
| 6,054,873 A | 4/2000 | Laramie |
| 6,108,760 A | 8/2000 | Mirsky et al. |
| 6,122,719 A | 9/2000 | Mirsky et al. |
| 6,127,908 A | 10/2000 | Bozler et al. |
| 6,202,182 B1 | 3/2001 | Abramovici et al. |
| 6,282,627 B1 | 8/2001 | Wong et al. |

\* cited by examiner

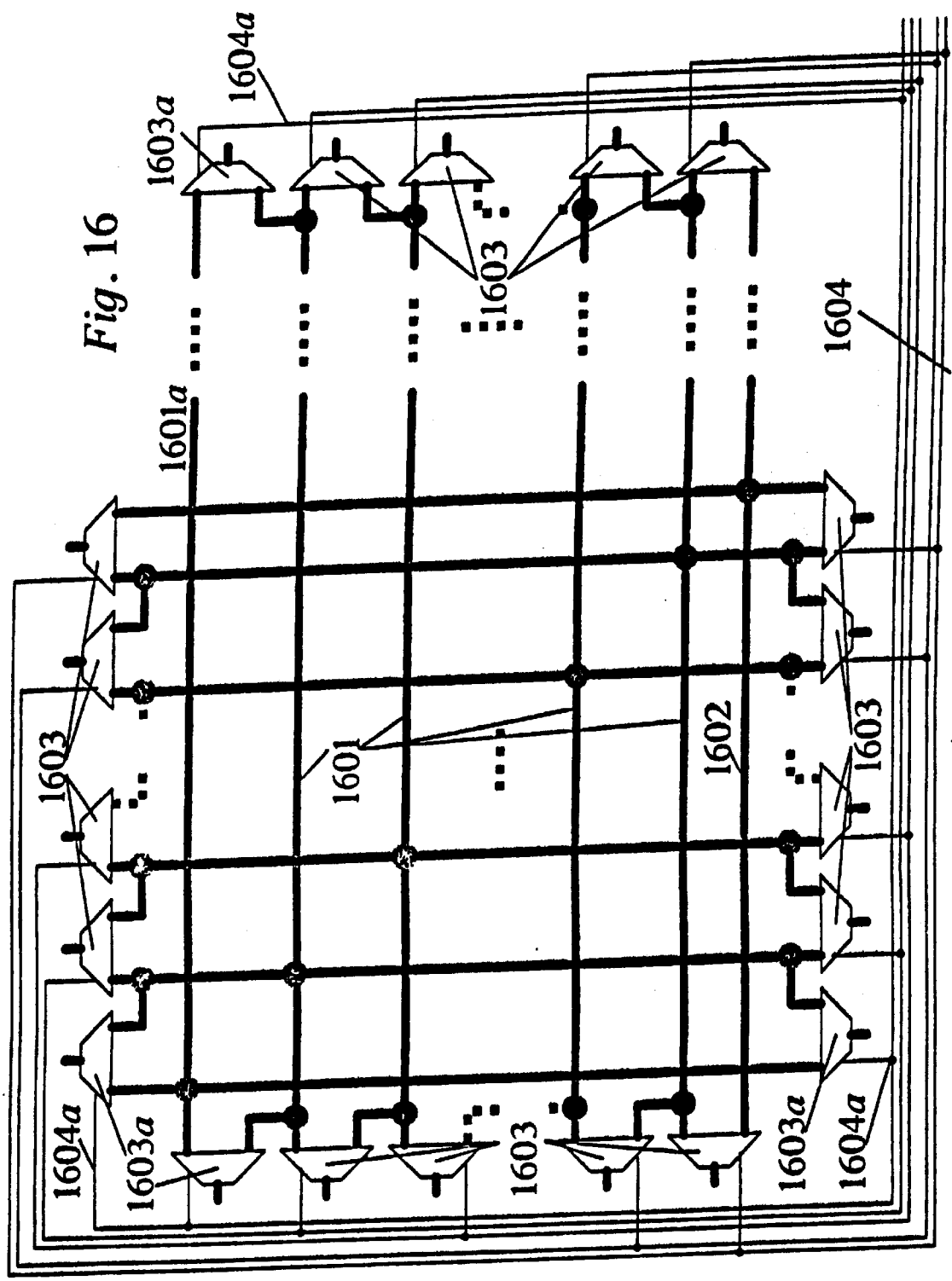

US 6,697,979 B1

METHOD OF REPAIRING INTEGRATED CIRCUITS

This application is a continuation of PCT/DE98/03682 filed on Dec. 15, 1998.

FIELD OF THE INVENTION

The present invention relates to an arrangement and method for repairing an integrated circuit.

BACKGROUND INFORMATION

German Patent Application No. 196 51 075.9-53 describes processors having a plurality of 2-dimensional or multidimensional arithmetic and logic units/cells. The computing power of such processors increases with the number of arithmetic and logic units present. Therefore, an attempt is made to integrate as many arithmetic and logic units as possible on one chip, which increases the area required. With an increase in area, there is also a higher probability of a chip having a manufacturing defect making it useless. All arithmetic and logic units arranged in matrix form have this problem, e.g., including other known types such as DPGAs, Kress arrays, systolic processors and RAW machines; likewise, some digital signal processors (DSPs) having more than one arithmetic and logic unit.

At the same time, all the aforementioned types require a great deal of testing, i.e., to detect faults, an especially large number of test cases must be generated and tested with respect to the functioning of the cells and the networking. Conventional methods such as BIST, boundary scan, etc. are difficult to integrate because of the large number of test vectors and they are also too time consuming and take up too much space.

Standard processors such as the x86 series, MIPS or ALPHA have a plurality of arithmetic and logic units which are driven at the same time by a VLIW command or with a time offset. In the future, the number of integrated units (integer units) and floating point units will continue to increase. Each unit must be tested adequately and must be largely free of defects.

Due to the increasing probability of defects with large chips, either only a very small number of cells can be integrated or production costs will increase greatly due to the resulting rejects. Very large chips will reach a maximum area beyond which a functional chip can no longer be produced. Due to the time consumed in testing according to conventional methods, there is a great increase in testing costs. Integrated BIST functions (built-in self-test) take up a great deal of area due to the high extra complexity, driving costs even higher and reducing manufacturing feasibility. In addition, this greatly increases the probability of a defect lying not within the actual function units but instead within the test structures.

Due to the increasing number of arithmetic and logic units, there is also an increase in the probability of defects. This means more rejects, causing manufacturing costs to increase. With an increase in area and a related increase in the number of transistors used, there is also an increase in probability of failure during use.

With regard to testing complexity and implementation of BIST, the discussion above regarding "multidimensional arrays of arithmetic and logic units" also applies here.

SUMMARY OF THE INVENTION

The present invention provides for replacing defective cells with functional cells and reducing rejects. A cell can be replaced either by the test systems at the time of manufacture of the chips or even by the user in the completely assembled system. Test vectors can be generated according to the BIST principle within the chip, or outside the unit according to a new method to save on space and costs. In addition, a possibility of chips automatically repairing defects without requiring any additional external tool is described. All the tests and repairs can be performed during operation of the chips.

An additional PAE not used in normal operation (referred to below as PAER) is assigned to a group of cells which are referred to below as PAEs according to German Patent 196 51 075.9-53. The cells may be arithmetic and logic units of any type, configurable (programmable) logic cells or other cores having any desired function. Grouping of the PAEs in rows or columns is preferred in the grouping of PAEs and allocation of the PAER, because this simplifies the networking. With respect to future chip technologies, reference is made to a possible grouping of the PAEs within a $3^{rd}$ dimension. Multiplexers are connected upstream from the inputs of the PAEs in such a way that the input of the first PAE in the row/column can also be switched to the input of the second PAE in the row/column, and then the input of the second PAE can be switched to the input of the third PAE and so forth. The input of the last PAE is switched to the input of the PAER. This means that if there is a defect in the first PAE, its function is replaced by the second PAE, the function of the second is replaced by the third and so forth, until the function of the last PAE is replaced by the PAER. If a PAE within the column/row is defective, the PAEs upstream from it are switched normally and after the position of the defective PAE, all functions are shifted by one PAE. For example, if PAE 4 is defective, then PAEs 1 . . . 3 execute their respective functions, while the input multiplexer of PAE 5 is switched so that it receives the data of PAE 4, the input multiplexer of PAE 6 receives the data of PAE 5 and so forth until the input of the PAER receives the data of the last PAE.

To supply the results back to the network in the proper sequence, multiplexers are also provided at the outputs of the PAEs, with the output multiplexer of PAE 1 either switching PAE 1 to the bus (if it is not defective) or if there is a defect, switching the output of PAE 2 to the bus, PAE 3 is switched to the bus instead of PAE 2, until the last PAE, where the PAER is switched in its place. If the defective PAE is in the middle of the row/column, the outputs are shifted exactly as already described above for the inputs.

Especially with a configurable logic and configurable arithmetic and logic units, there are additional bus systems to transfer the configuration data and control the configuration. These bus systems are also connected by multiplexers in the same way as the buses mentioned in this section. The same thing is also true of bus systems over which commands are written to the respective arithmetic and logic units with a matrix arrangement of arithmetic and logic units (e.g., systolic processors, SIMD, etc.). Basically any bus or any signal can be sent over multiplexers. Depending on the fault tolerance requirements, the clock signal, for example, can be sent over multiplexers to prevent a possible short circuit, or the clock signal may be sent directly to the cell because such a failure need not be compensated. The fault tolerance step can be defined in the structural details according to the requirements for each signal or each bus individually.

The concept of correcting faults within gate structures may also be applied to bus systems in which an additional bus (BUS R) is assigned to a number of buses (BUS 1 . . . BUS n). If one of the buses is defective (BUS d), its function is assumed by one of its neighboring buses (BUS (d+1)). The function of the neighboring bus (BUS (d+1)) is assumed by its neighboring bus (BUS (d+2)), etc., with the direction of the bus assuming the function always remaining the same until the function of BUS n is assumed by BUS R.

When multiplexer structures are used with bus systems, the usual multiplexers, decoders and gates, tristate gates or bidirectional multiplexers are used according to the prevailing connection structure and the direction of the data.

Two groups of successive multiplexers should always assume the same state, i.e., MUX 1=MUX 2=MUX 3=. . . =MUX n=state A, and MUX (n+1)=MUX (n+2)=MUX (n+3) . . . =MUX m=state B.

If no PAE is defective, then MUX 1=MUX 2=. . . MUX m=state A.

If the first PAE is defective, then MUX 1=MUX 2=. . . =MUX m=state B.

For example, if PAE 3 is defective, then MUX 1=MUX 2=state A, MUX 3=MUX 4=. . . =MUX m=state B, with PAER being assigned to PAE m in this example, i.e., PAER is directly next to PAE m.

The multiplexers are therefore controlled as follows, for example:

| Defective PAE | Multiplexer control |
| --- | --- |
| none | 0000 . . . 000 |
| m | 0000 . . . 001 |
| m-1 | 0000 . . . 011 |
| m-2 | 0000 . . . 111 |
| 4 | 0001 . . . 111 |
| 3 | 0011 . . . 111 |
| 2 | 0111 . . . 111 |
| 1 | 1111 . . . 111 |

If PAER is assigned to PAE 1, the m . . . 1 sequence is inverted (defective PAE 1 corresponds to 0000 . . . 001, or defective PAE m corresponds to 1111 . . . 111).

Therefore, it is sufficient to store the number of the defective PAE and send it to a decoder which controls the states of the multiplexers on the basis of the table given above.

Any desired test strategies may be applied to this method, but it is advantageous to apply the methods according to the present invention.

The array of PAEs is loaded with one or more test algorithms which calculate one or more test vectors. At one edge of the array, the PAEs are wired as comparators so that the values calculated on the basis of the test vectors are compared to the setpoint results.

If the calculated result does not correspond to the setpoint results, there is a defect. The test data, i.e., the test algorithms, the test vectors and the setpoint results are present in an internal or external memory or are loaded by a higher level unit. In this test strategy, it is necessary for each test algorithm to be calculated at least twice, with the PAEs designed as comparators being on another edge (preferably the opposite edge) the second time to guarantee execution of the test algorithm on all PAEs. It is also conceivable for the comparators to be arranged in the interior of the PAE array, and with one test algorithm A and B each calculating one result A and B from left and right (top and bottom), where the results are sent to the comparators and must match. Depending on the type of test algorithm, the defective PAE may be tracked back on the basis of the defect or not. If the algorithm supports tracking of the defect, the corresponding multiplexer states of the row/column in which the defective PAE is located are changed and sent to the multiplexers. The test algorithm in which the test is failed is executed again to check on freedom from defects, which should now prevail. If the unit is still defective, a check must be performed to determine whether an additional or other PAEs are defective. Execution of the test algorithm and generation of the multiplexer states adapted to the defect are iterative processes. It is not usually sufficient to implement just one test algorithm, but instead multiple different test algorithms may be implemented, each being checked with multiple test vectors. Only in this way can a maximum fault detection rate be achieved.

At the same time, the bus crosslinking must be changed from one test algorithm to the next, so that the bus systems are also checked adequately.

The various embodiments of the test algorithms will not be discussed in further detail here because this is not entirely relevant for the basic method according to the present invention.

Units such as described in German Patent Application No. 196 51 075.9-53, DPGAs, Kress arrays, systolic processors and RAW machines all have in common an integrated memory which is assigned to one or more PAEs and determines the function of the arithmetic and logic unit(s).

According to the basic BIST principle, the memory is expanded by a region (TestMEM) containing the test algorithms and vectors. This memory can be fixed in the form of a ROM or it may be rewritable by (E)EPROM, flash ROM, NV-RAM or the like.

To perform a self-test, the system jumps to a memory location within the TestMEM and executes the test routine stored there (internal driven self-test=IDST). Except for the expansion of the memory (by the TestMEM) and an analyzer unit for the comparators described above (ErrorCHK), no other additional units typical of BIST are needed on the chip.

The reduction in components on a memory expansion (TestMEM) and an analyzer unit of the comparators (ErrorCHK) permit an additional, even less expensive and space-saving variant. No internal TestMEM is implemented here, but instead the usual internal memory is loaded from the outside with the test algorithm and the test vectors (external driven self-test=EDST); this means that the BIST test data is shifted outward and regarded as a normal program. Then the test algorithm is executed. As an alternative, the test algorithm may also be loaded successively from an external memory during the execution and decoded. Only the ErrorCHK unit must still be integrated on the chip. There are several possibilities for loading the test algorithm and the test vectors from the outside into the chip-internal memory (memories). In principle, the process can take place through a functionally higher level CPU or computer unit (HOST), with the latter loading the test data (test algorithm and test vectors) onto the chip (download) or the chip loading the test data automatically from an external (dual-ported) RAM or read-only memory such as ROM, (E)EPROM, flash ROM, NV-ROM or the like.

Conventional BIST methods usually perform the self-test only during the chip RESET phase, i.e., shortly after applying a voltage (when turned on). In contrast, it is possible or practical to perform the methods described here on the chips while the programs are running. For example, a complete test of the chip can be performed during the RESET phase and part of the available test data can be loaded during execution of the application program or during IDLE cycles, i.e., periods of time when no program is running on the chips or the chip is in a waiting mode. This is readily possible by the fact that one of the test algorithms is activated in the internal memory during IDLE cycles or is loaded into the unit from an external memory or host. It is of course possible to select one or more of the plurality of available test algorithms and test data in part, in which the number of selected test data can be defined on the basis of the length of the IDLE cycle. New test data can be loaded until the IDLE cycle is ended by the arrival of new data to be processed, by a new program to be executed or by another request.

Another possibility is the fixed integration of test strategies into the application programs to perform tests during processing of the application program. In both cases, the relevant data in the array is saved before calling up the test algorithms. One option is to save the data either in internal memory areas (cf. PACT04) or in memories connected externally. After executing the test algorithms, the data is read back before the normal program processing.

One alternative for increasing the execution speed is to implement in addition to each register (Reg-n, n ∈ N) an additional register (TestReg-n, n ∈ N) which is used only for the test algorithms. Before execution of the test algorithms, the TestReg-n are connected by multiplexers/demultiplexers (gates) and used for the test. The Reg-n remain unchanged. After execution of the test algorithms, the Reg-n are connected again.

If the test strategy provides for testing of only those cells whose data is no longer relevant subsequently, the data need not be saved and loaded.

If a PAE (or a bus) is recognized as defective, its number, i.e., the state vector (defect identifier) of the assigned multiplexer must be stored first to control the multiplexers and also to be available immediately for a chip RESET. Therefore, the defect identifier may be stored
1. internally in the chip in a programmable read-only memory ((E)EPROM, flash ROM, NV-RAM, etc.),
2. externally in a programmable read-only memory ((E) EPROM, flash ROM, NV-RAM, etc.), or
3. externally in the HOST within the program to be executed, in its programmable read-only memory ((E) EPROM, flash ROM, NV-RAM, etc.) or in other storage media (magnetic, optical, etc.).

Usually after detection of a defect, the defective cell is tracked on the basis of the defective performance detected. This is possible with appropriate test algorithms if there is an additional algorithm for tracking the defect. If the test is controlled by a HOST, the tracking can be performed on the HOST. However, if there is no HOST, tracking often cannot be integrated into the defective chip or is too complicated. It is possible that a loadable counter be integrated upstream from each decoder. In the normal case, the number of the defective PAE is loaded into the counter, after which the decoder controls the states of the multiplexers as described above. If it is not known which PAE is defective, beginning at PAE 0 or PAE m the counter can function in response to any potentially defective PAE by reducing the count by one PAE (counting from PAE m) or increasing the count by one (counting from PAE 0) after each unsuccessful test until the defective PAE is reached and the test takes place normally. The count then reached is stored as the state vector for controlling the multiplexers and represents the defective PAE. If a functional count is not found, there is either another defect (possibly in another row/column or a bus error) or more than a PAE is defective. One disadvantage when using counters is that all possibilities are permutated until the defective PAE has been located.

Another possibility, although it requires a greater implementation expense, is to use look-up tables which select the corresponding defective PAE on the basis of the test algorithm just executed and the resulting error state in ErrorCHK. The test algorithms and look-up tables being coordinated. The coordination will not be discussed further here because it is highly chip-specific and does not depend on the basic principle.

Processors includes a plurality of integer units and floating point units. Therefore, the method described here can be applied directly to these units by having an additional unit in each case which will be available for possible defects. The test of the processors can be performed at the manufacturer's, during startup of the computer or also during the operating time. A test maybe performed during boot-up, i.e., starting up of the computer after a reset, which is performed with PCs of the BIOS type (BIOS=basic input output system). The corresponding state vectors of the multiplexers can be stored either on the processor or in an external memory, e.g., the battery-buffered real-time clock (RTC) in a PC.

The present invention provides for replacing defective units, which are designed as arithmetic and logic units, for example, but in general may be any desired unit of a chip, with a functional unit. The present invention provides a method with which self-tests can be performed more easily, less expensively and before or during the running of the application program. The present invention greatly increases fault tolerance during operation, which is advantageous for failure-critical applications such as power plant operations, aviation and space travel or in the military, for example.

BRIEF DESCRIPTION OF THE DRAWINGS

FIG. 16 illustrates a fault-tolerant bus system according to the present invention.

DETAILED DESCRIPTION

Figure 1:
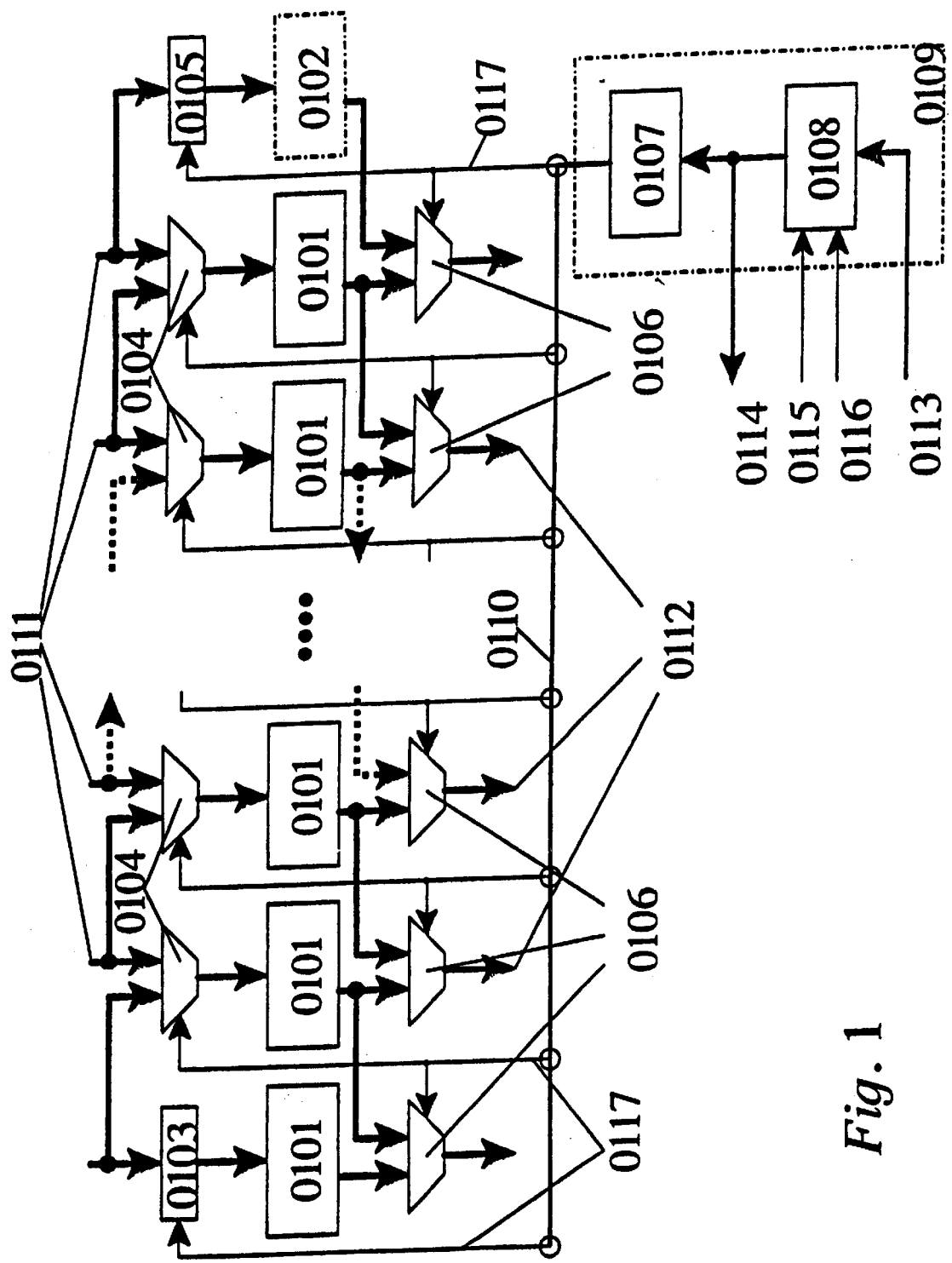
FIG. 1 illustrates a circuit arrangement according to the present invention.

FIG. 1 shows the basic principle of a fault-tolerant configuration. All the PAEs (0101) are arranged in a row with the additional PAER (0102) being assigned to the last PAE. Upstream from the first PAE in the row, a gate (0103) is connected to block the data to the PAE if that PAE is defective. Likewise, a gate (0105) is connected upstream from the PAER (0102) to block the data to the PAER if it is not needed (or is defective). The two gates (0103 and 0105) may be optional. The input buses (0111) carrying a plurality of individual signals are directed over multiplexers (0104) and the gates (0103 and 0105) to the PAEs. After a defect, data can be shifted by one PAE to the right in each case up to the PAER. Upstream from the output buses (0112), which carry a plurality of individual signals, there are also multiplexers (0106) which again shift the results by one position to the left in the event of a defect, so the defect is not detectable for the result bus system (quantity of all 0112). The individual control signals (0117) for the respective multiplexers and gates are combined to give one bus (0110) and are generated by a decoder (0107). The decoder receives the number of the defective PAE from unit 0108, which is designed either as a register or as a loadable counter. When using a look-up table to detect the defective PAE from the error generated by ErrorCHK, 0108 is implemented as a register into which the number of the defective PAE is loaded. If the defective PAE is sought by a permutation, 0108 represents a loadable counter which counts through all possible PAEs, starting from 0, until the defective PAE is located. Once the defective PAE has been identified, it is loaded directly into the loadable counter in the next RESET operation. The load signal LOAD (0115) is available for loading the counter or register (0108). To increment the counter, the COUNT signal (0116) is sent to the counter. The counter result is returned by way of signals 0114 for storage. The counter/register is driven and the chronological sequence is controlled by a state machine (not shown), an external HOST or a device as described in German Patent Application No. 196 54 846.2.

Figure 2:
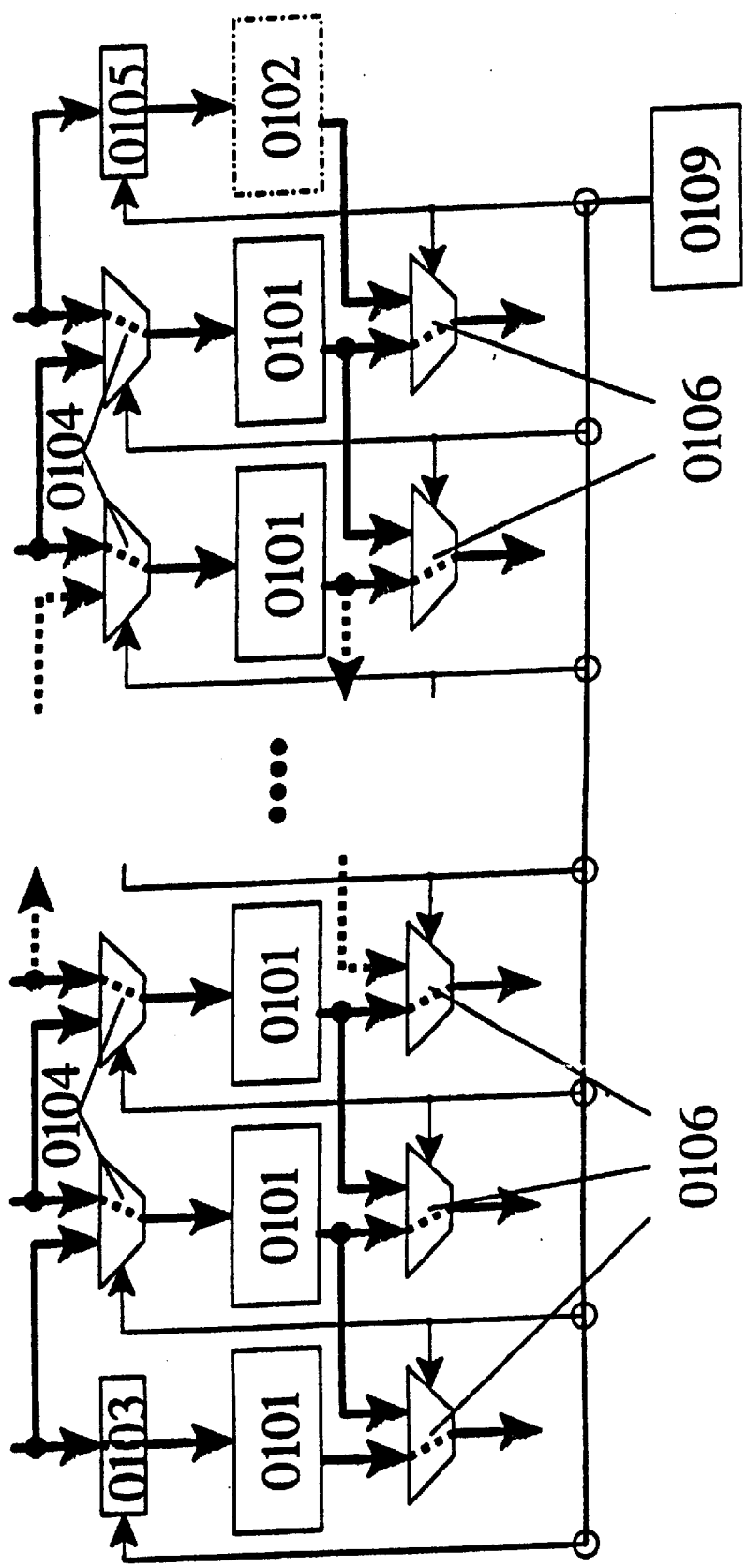
FIG. 2 illustrates elements of the circuit arrangement in a first state according to the present invention.

FIG. 2 shows the states of the multiplexers (0104 and 0106) as well as the gates (0103 and 0105) where no PAE is defective and the PAER (0102) is not used.

Figure 3:
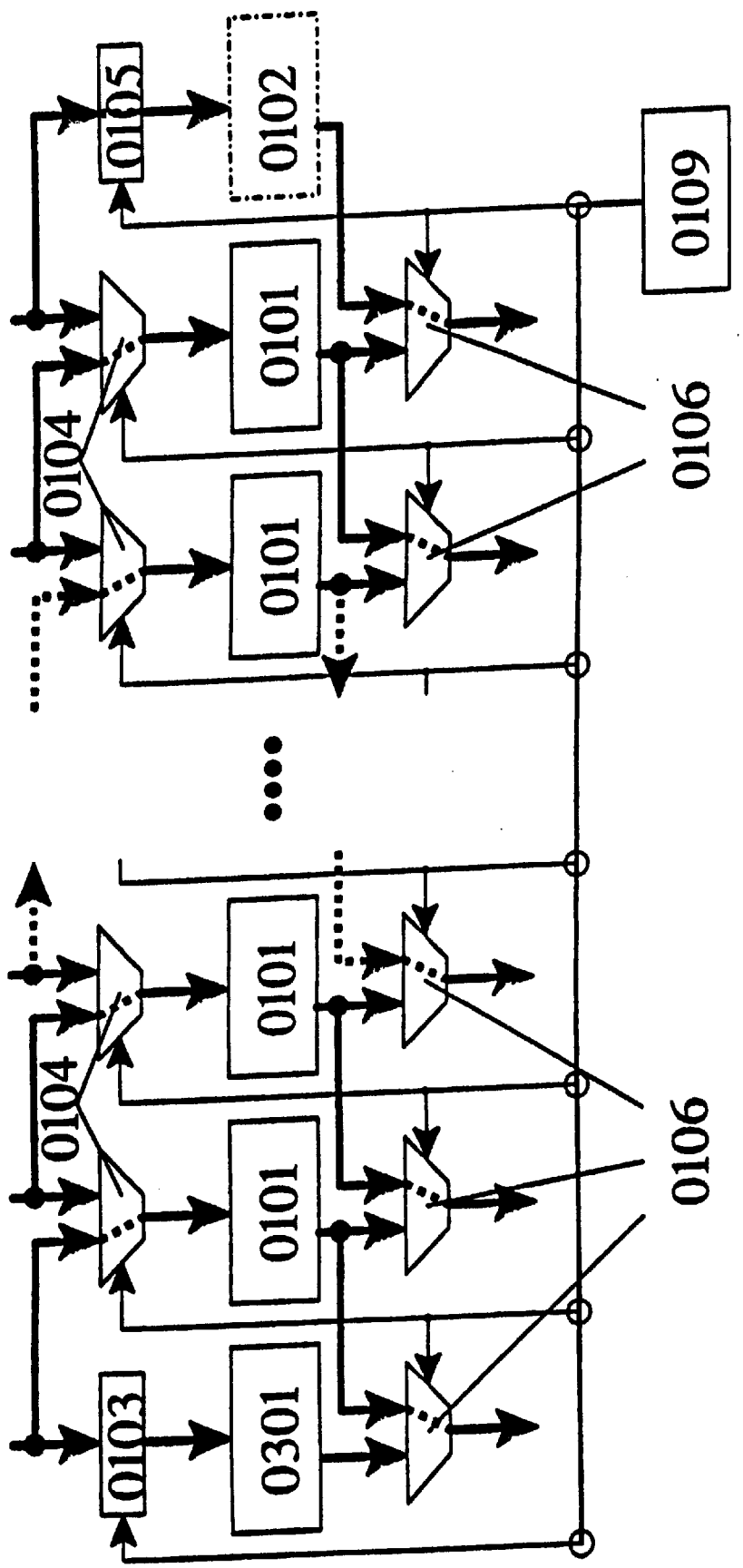
FIG. 3 illustrates elements of the circuit arrangement in a second state according to the present invention.

FIG. 3 shows the states of the multiplexers (0104 and 0106) as well as the gates (0103 and 0105) where PAE 1 (0301) is defective and the PAER (0102) is used.

Figure 4:
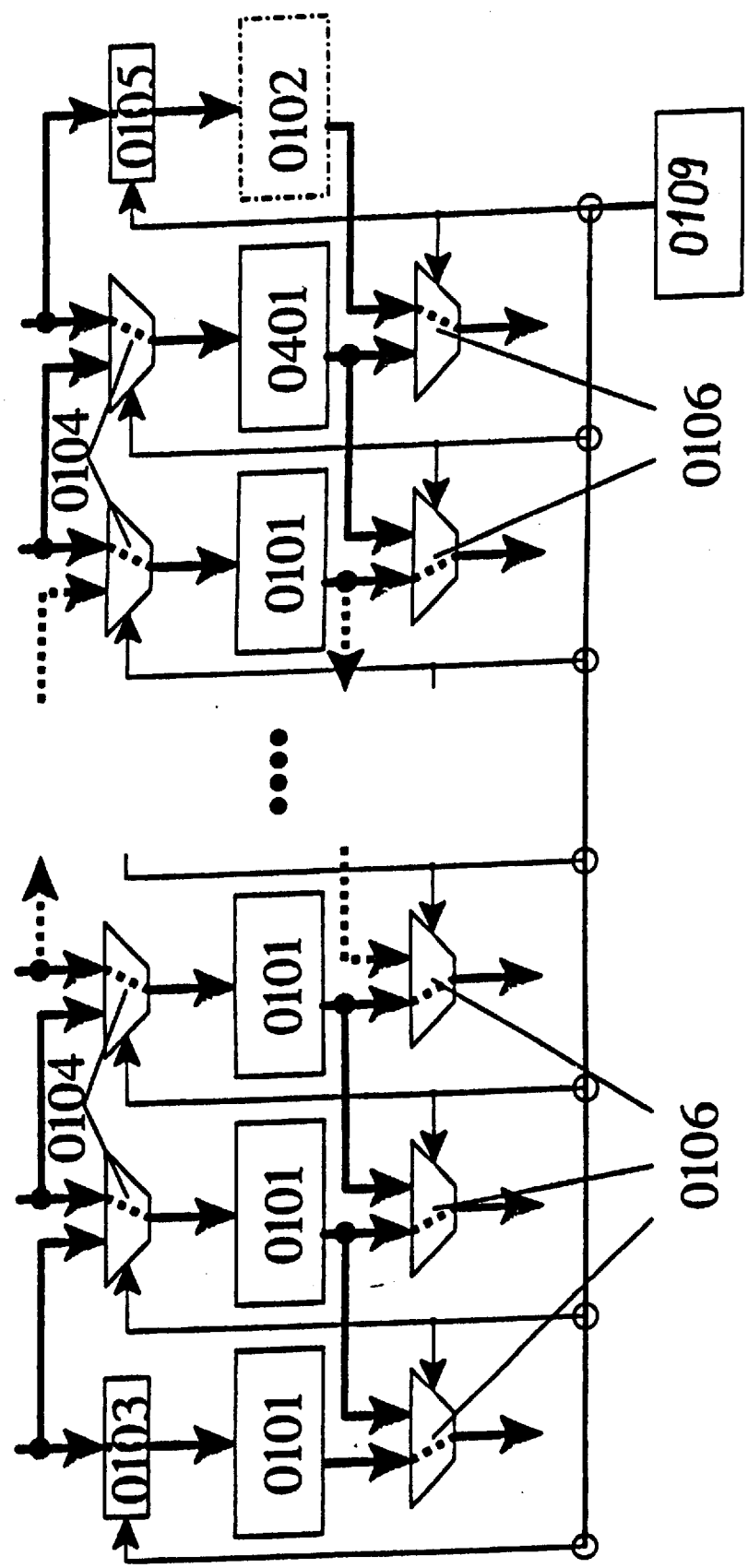
FIG. 4 illustrates elements of the circuit arrangement in a third state according to the present invention.

FIG. 4 shows the states of the multiplexers (0104 and 0106) as well as the gates (0103 and 0105) where PAE m (0401) is defective and the PAER (0102) is used.

Figure 5:
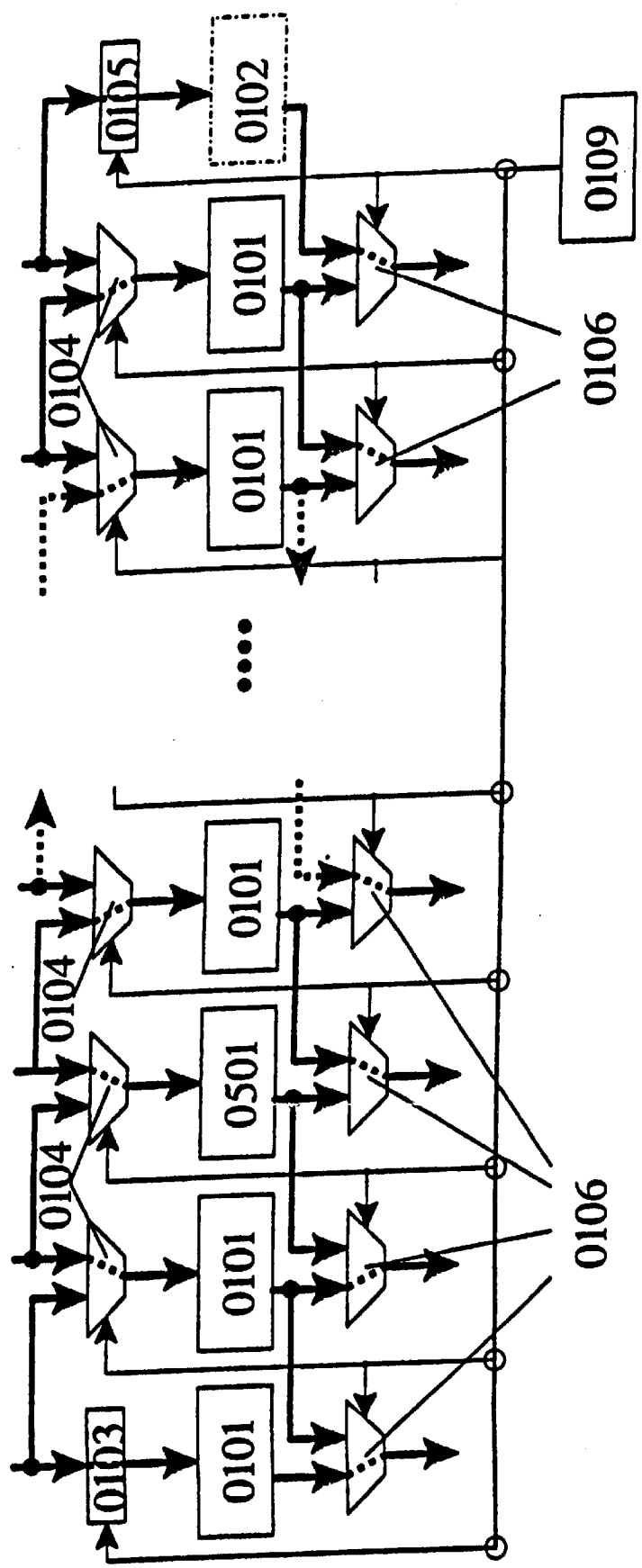
FIG. 5 illustrates elements of the circuit arrangement in a fourth state according to the present invention.

FIG. 5 shows the states of the multiplexers (0104 and 0106) as well as the gates (0103 and 0105) where PAE 3 (0501) is defective and the PAER (0102) is used.

Figure 6:
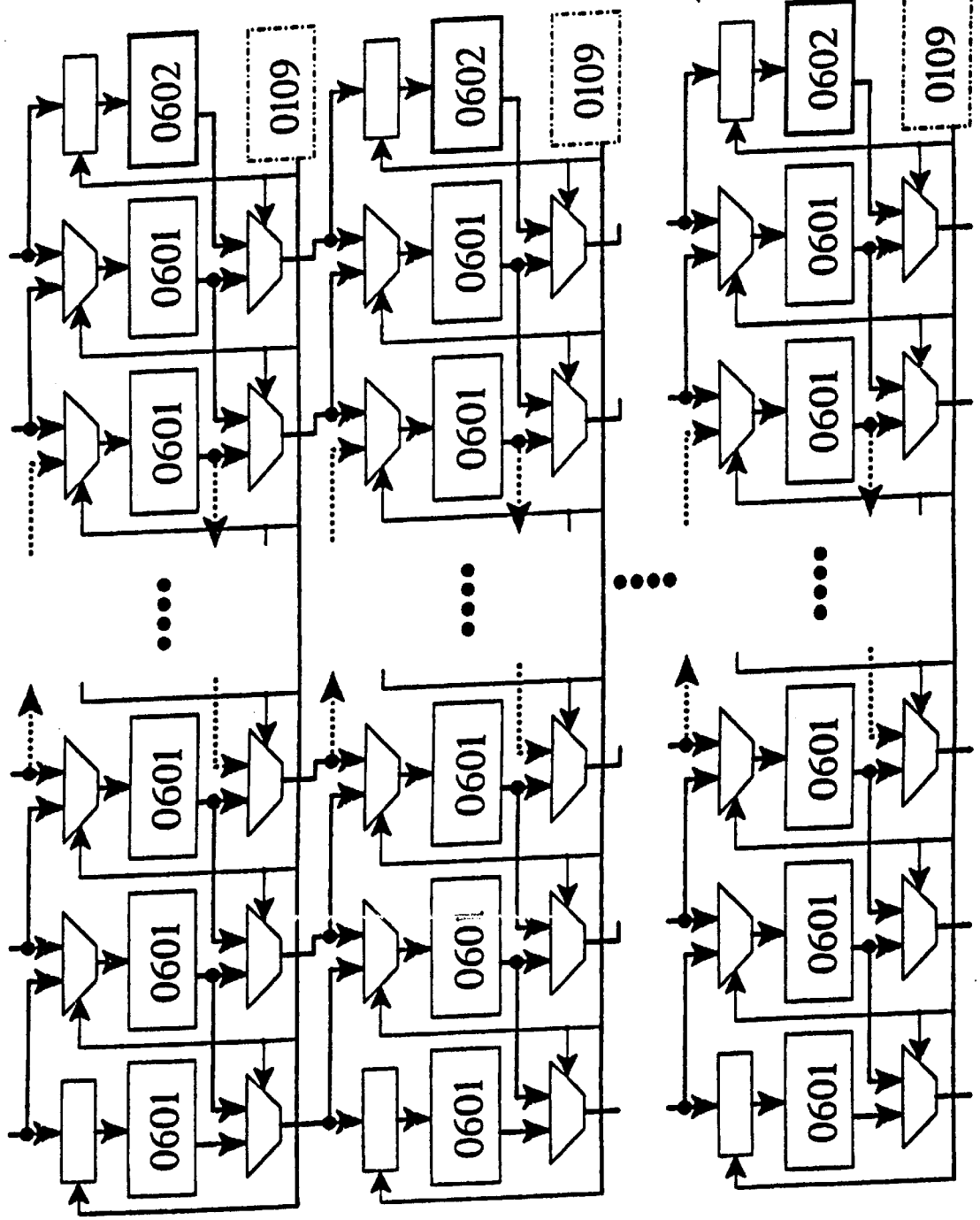
FIG. 6 illustrates another circuit arrangement according to the present invention.

FIG. 6 shows an array of PAEs (0601), where one PAER (0602) is assigned to each PAE row, and each row has a separate control (0109, see FIG. 1). A plurality of controls can also be combined to a single higher-order control above the rows.

Figure 7A:
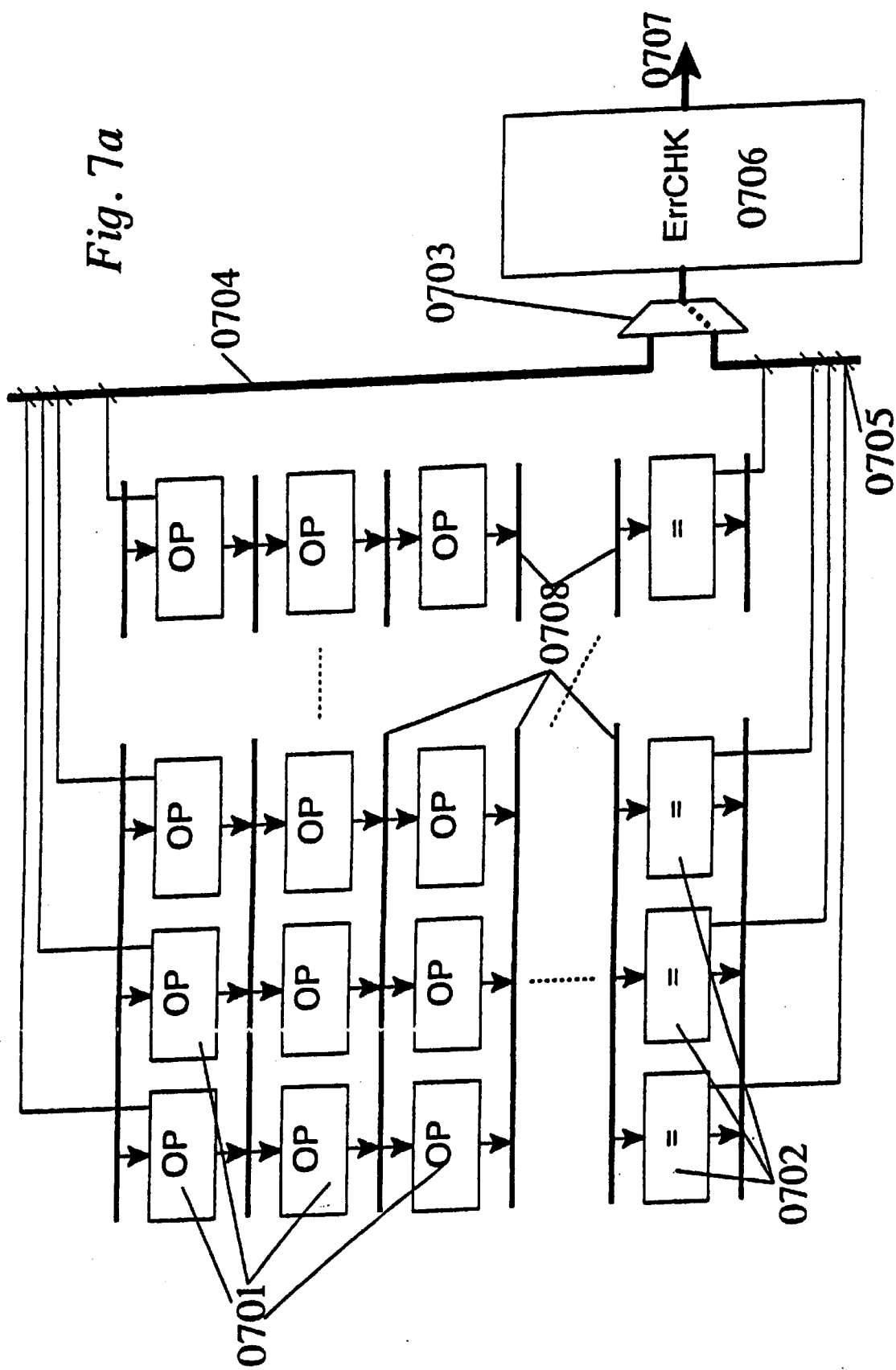
FIG. 7*a* illustrates a first test algorithm according to the present invention.

FIG. 7*a* shows a possible first test of an algorithm, with a plurality of PAEs being configured as processor elements (0701), each performing its operation by using a test vector. The PAEs are interconnected by bus systems (0708) of any desired design. One row of PAEs (0702) is configured as a comparator. The values calculated in the processor elements are compared to a predetermined value in the comparators. There is an error if the two values do not match. The results of the comparisons are sent over a bus system (0705) to a multiplexer (0703) which is connected so that it relays the results of the comparisons from (0702) to a unit (ErrorCHK 0706) of any desired design to detect an error and possibly analyze it. The error analysis (0706) sends its result over the bus (0707) to the HOST or to the controlling state machine (see FIG. 1).

Figure 7B:
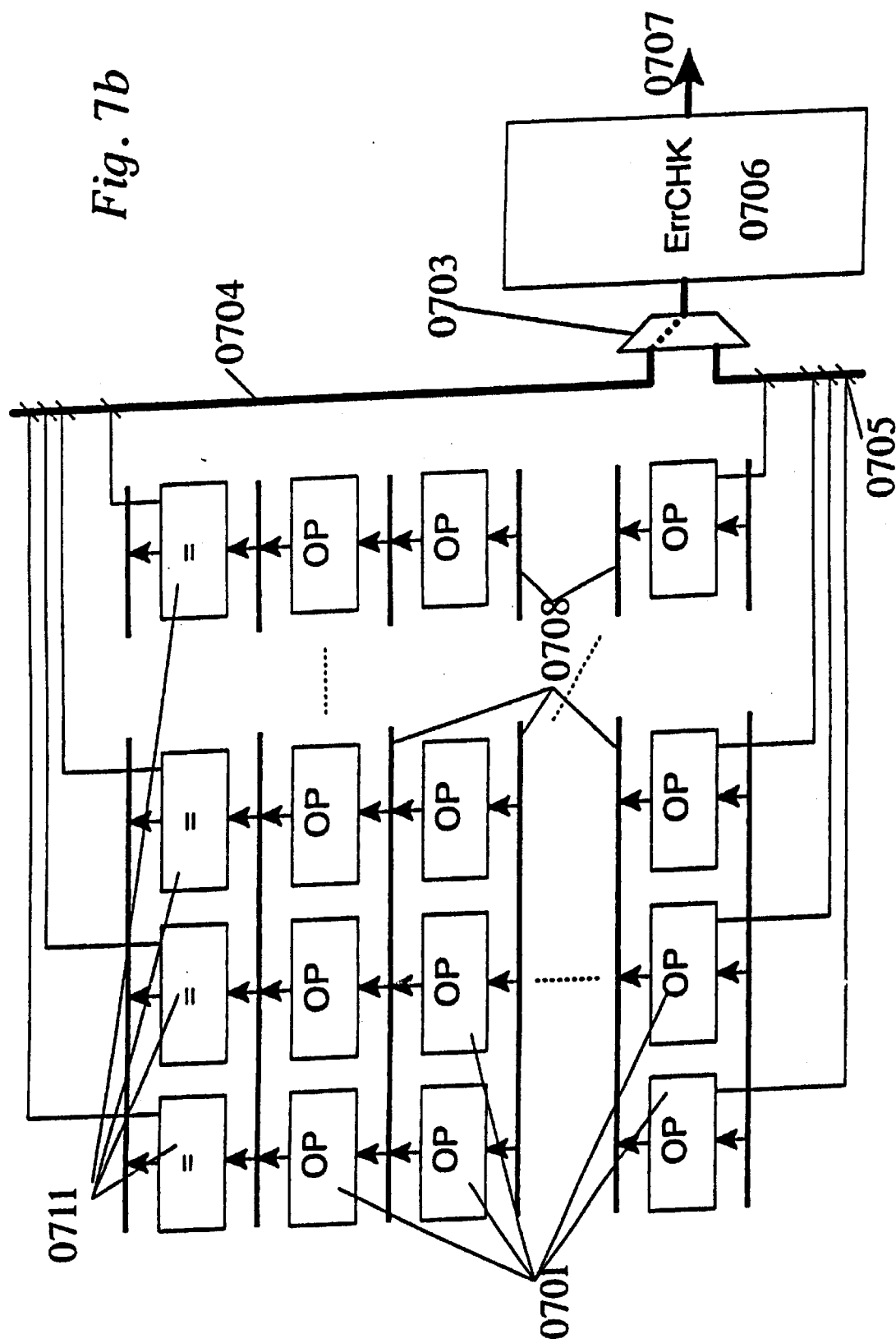
FIG. 7*b* illustrates a second test algorithm according to the present invention.

FIG. 7*b* shows a second test which is performed over the same matrix of PAEs as FIG. 7*b*. The algorithm to be executed is the same; likewise the values to be calculated. However, the PAEs of row 0702 are designed as normal processor elements, but with the first row of the PAEs (0701) connected previously as arithmetic and logic units (FIG. 7*a*) now being designed as comparators (0711). The direction of data flow on the bus systems is rotated by 180°. The multiplexer (0703) is connected so that the results of the (mirrored) comparators (0711) are relayed to the error analysis (0706). The mirroring of comparators (0702–0711) achieves the result that the function of each PAE is actually tested. If this mirroring were not performed, only the function of comparison but not any desired function is tested in a PAE row (0702 or 0711).

Implementation of a method other than that on which FIGS. 7*a* and 7*b* are based may be appropriate under some circumstances. The matrix here is subdivided into three groups, an upper group, a middle group and a lower group. In the upper and lower groups, results are calculated, with the data flow of the upper group being downward and the data flow of the lower group being upward. The middle group is configured as a comparator and compares the calculated values of the upper group with those of the lower group. The upper and lower groups usually perform the same calculations. There is an error if the results obtained at the comparators are different. Again with this method, the PAEs which are connected as comparators are tested adequately for freedom from defects in the next configuration.

Figure 8C:
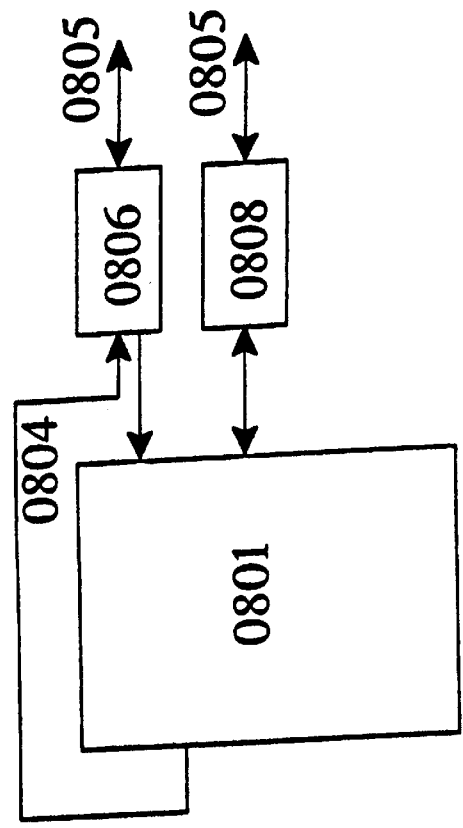
FIG. 8*c* illustrates a third configuration that tests the chip according to the present invention.
Figure 8A:
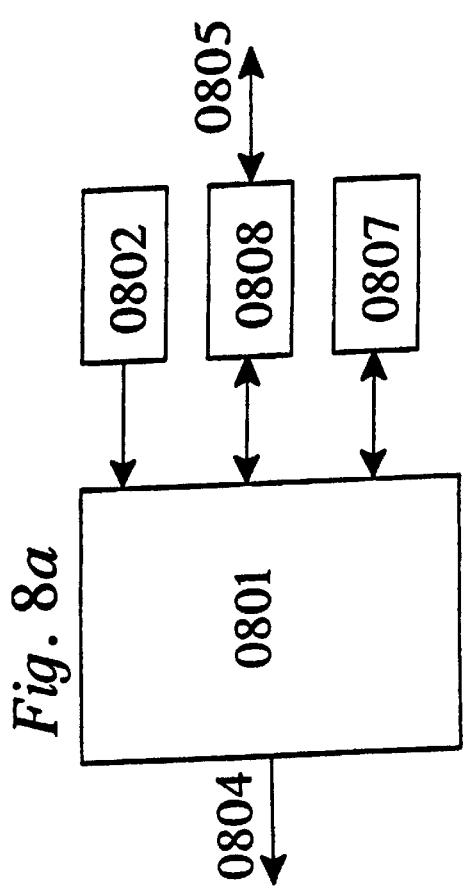
FIG. 8*a* illustrates a first configuration that tests a chip according to the present invention.

FIGS. 8*a, b, c* show possible circuits for testing a chip (0801). The test data is stored externally here (EDST).

In FIG. 8*a* the test data is in an external read-only memory ((E)PROM, ROM, flash ROM, etc.) (0802). The data is in a RAM (0808) through which it is exchanged with the HOST (0805). A non-volatile read-write memory (NV-RAM, EEPROM, flash ROM, etc.) (0807) is used to store the defective PAEs, i.e., the state vectors of the multiplexers.

Figure 8B:
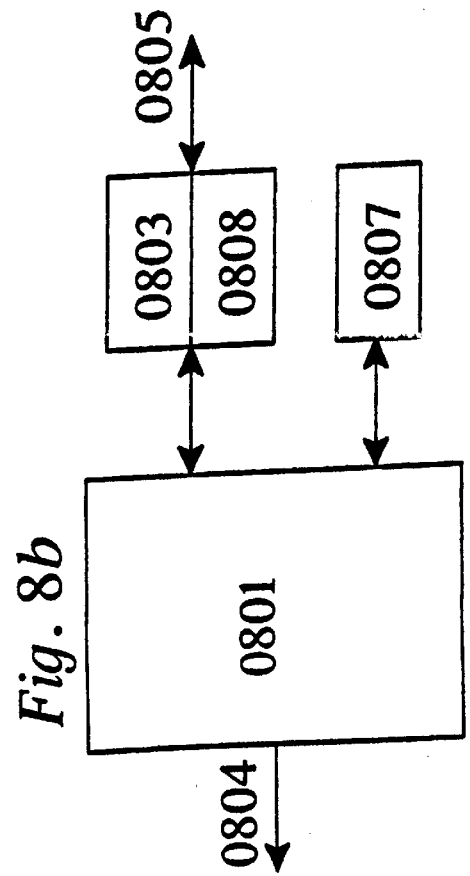
FIG. 8*b* illustrates a second configuration that tests the chip according to the present invention.

In FIG. 8*b*, the test data is loaded by a HOST (0805) into part of the RAM (0803) and executed from there. The data is in a RAM (0808) through which it is exchanged with the HOST (0805). It is also possible for the chip itself to load the data into the memory area (0803, 0808) (without the use of a HOST), e.g., directly from a bulk storage device. A non-volatile read-write memory (NV-RAM, EEPROM, flash ROM, etc.) (0807) is used to store the defective PAEs, i.e., the state vectors of the multiplexers.

The errors generated by the chip in FIGS. 8a/8b are brought out of the unit and are available externally (0804).

In FIG. 8c the test data is transmitted incrementally from a HOST (0805) to the chip (0801) using a suitable interface (0806). The chip indicates a possible error state (0804) to the HOST through the interface (0806). The data is in a RAM (0808) through which it is exchanged with the HOST (0805).

Figure 9:
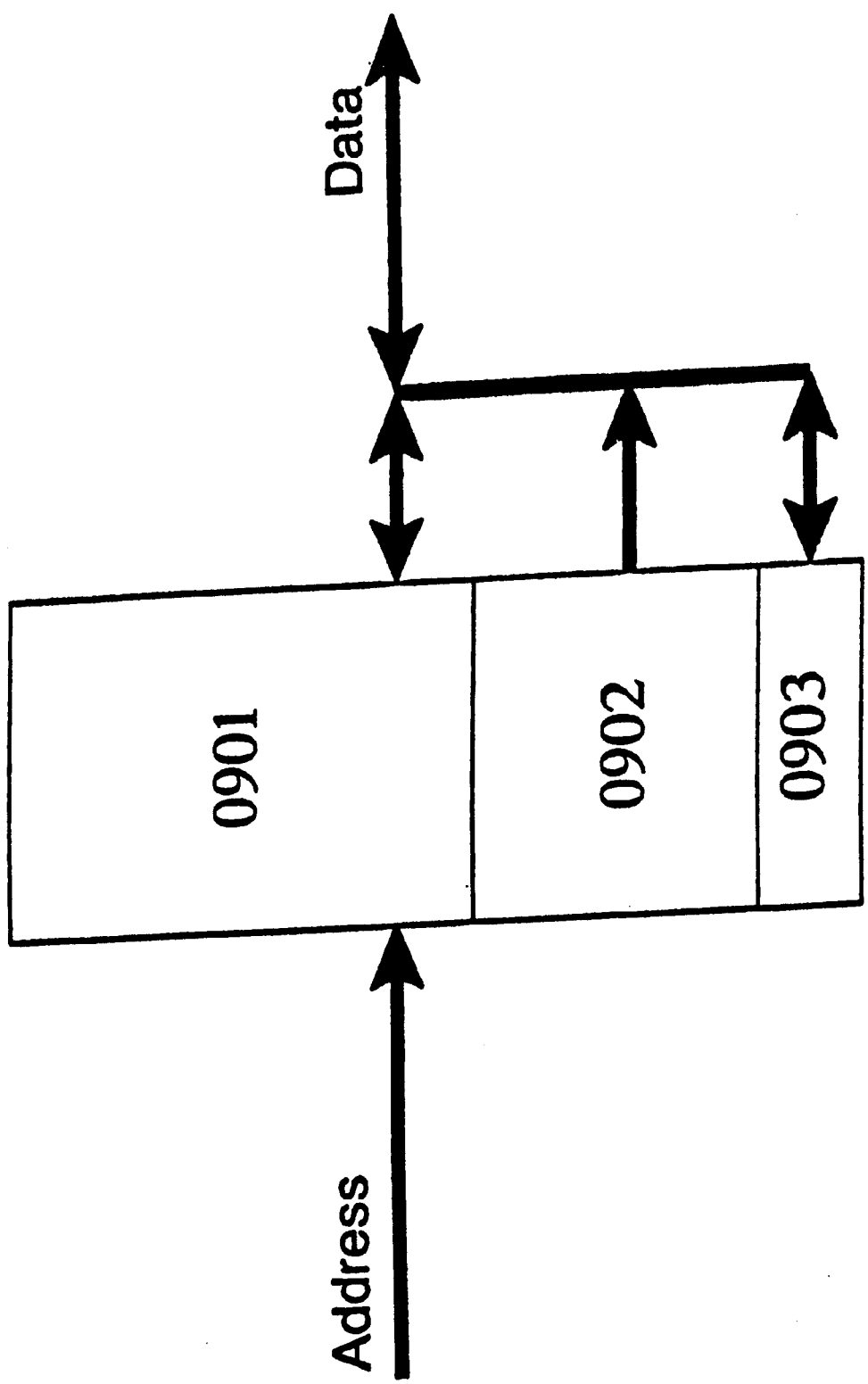
FIG. 9 illustrates a chip-internal memory with a BIST function according to the present invention.

FIG. 9 illustrates an expansion of a chip-internal program memory or configuration memory as described in German Patent Application No. 196 54 846.2 by the addition of a BIST function according to the method according to the present invention. A conventional memory area (0901) is expanded here by a read-only memory area (0902), which may be implemented as ROM, but implementation as (E)EPROM, flash ROM, NV-RAM, etc. in which the test data, i.e., the test algorithms and test vectors are stored would also be possible. At the end of the memory, another memory area (0903) is added. It is a few entries in size and includes the addresses of defective PAEs and/or defective buses which are loaded into the counters/registers (0108). This memory area is designed as a non-volatile read-write memory (flash ROM, EEPROM, NV-RAM, etc.). Thus, the data can be read out in a RESET and written over with the instantaneous data after execution of a test algorithm where a reparable defect is found. This data is supplied by the counters (0108, bus 0114) or by the look-up tables, depending on the implementation.

Figure 10:
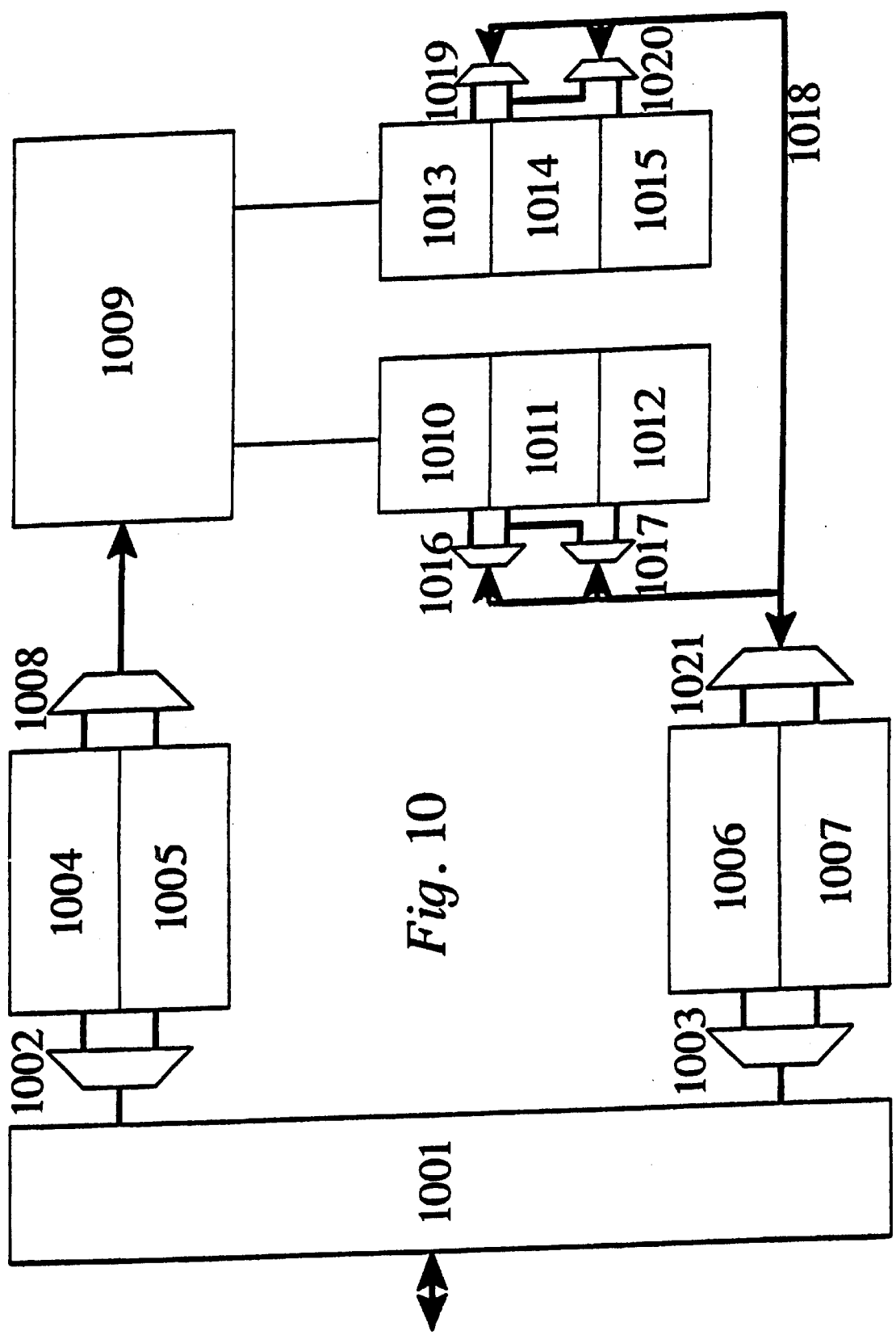
FIG. 10 illustrates a fault-tolerant processor according to the present invention.

FIG. 10 shows an example of a standard processor with fault correction implemented. The processor is connected to its peripherals over the bus interface (1001). Two multiplexers (1002 and 1003) are assigned to the bus interface, with 1002 controlling two alternative code caches (1004, 1005) and 1003 controlling two alternative data caches (1006, 1007) so that only one of the caches is used at a time. Thus, one cache is always available for compensating for defects and can be addressed over the multiplexers. The code cache leads over a multiplexer (1008) to the control unit (1009) of the processor, only one of which is used in this example. The integer units (1010, 1011, 1012) and the floating point units (1013, 1014, 1015) are controlled by the control unit. Two are always in operation at a time, with a third being available if one of the units fails. Two integer units are connected to the data bus (1018) over the bidirectional multiplexers (1016, 1017), and two floating point units are connected to the data bus (1018) over the bidirectional multiplexers (1019, 1020). The data bus is connected to the data cache over a bidirectional multiplexer (1021). Multiplexer 1003 is also designed to be bidirectional. The multiplexers are controlled according to the method described above. Multiplexers 1002, 1008, multiplexers 1003, 1021, multiplexers 1016, 1017 and multiplexers 1019, 1020 each form a dependent group.

According to the method according to the present invention, the data cache and the code cache and one floating point unit and one integer unit can be replaced within the sample processor in the event of a fault.

Figure 11:
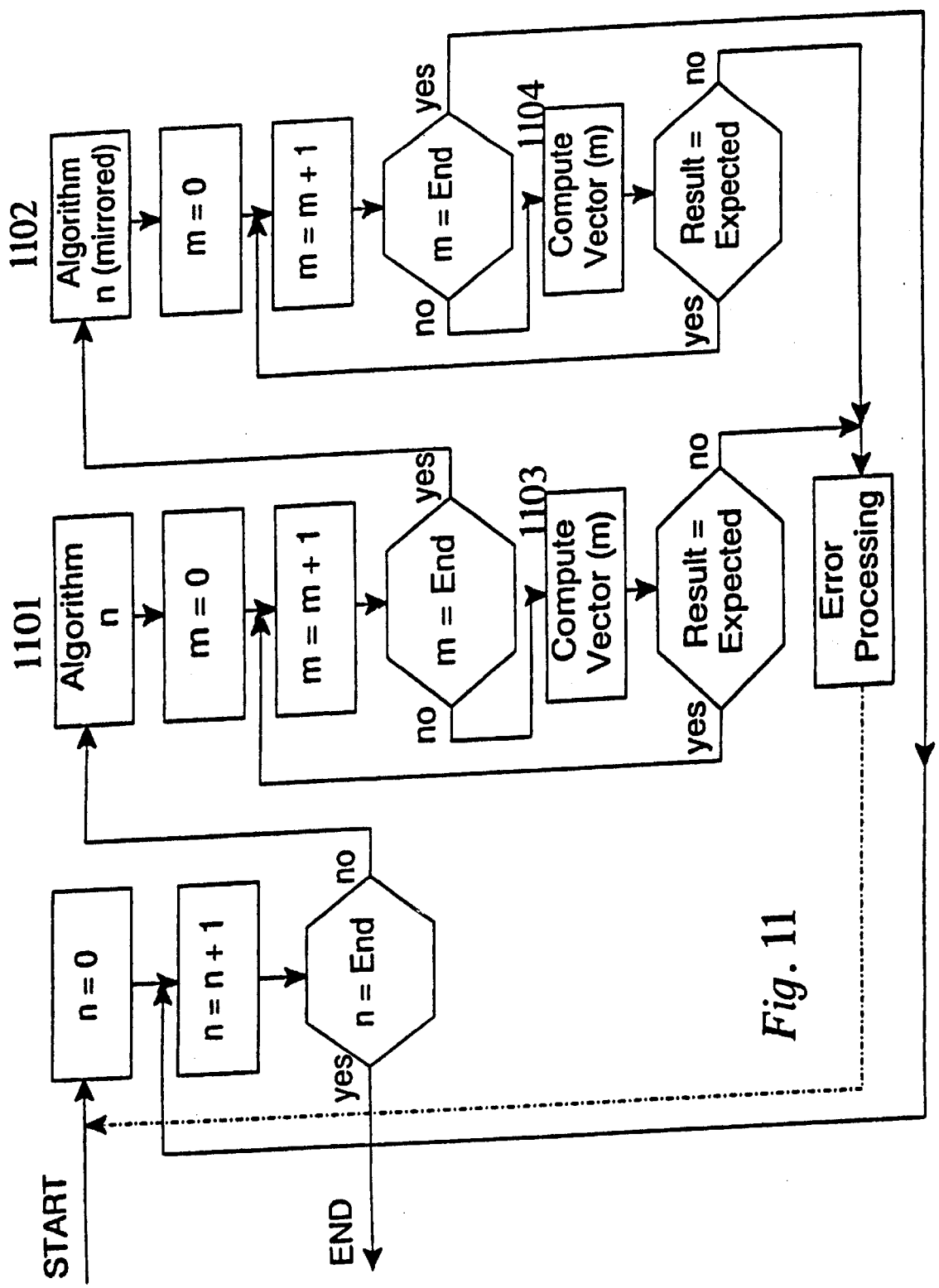
FIG. 11 shows a flowchart illustrating a self-test process according to the present invention.

FIG. 11 illustrates a self-test sequence. Variable n, n ∈ (1, 2, . . . ) is the index of all algorithms, and defines the algorithm being used at that time. Each algorithm is in a first position (1101) which corresponds to FIG. 7a, and a second mirrored position (1102) which corresponds to FIG. 7b. Variable m, m ∈ (1, 2, . . . ) is the index of the test vectors to be calculated and compared. Within each algorithm, the quantity of test vectors is tested completely and then the algorithm is changed either from 1101 to 1102 or from 1102 to a new algorithm (n=n+1). The test is terminated if n reaches the value after the last valid algorithm. If an error is found during calculation (1103, 1104) of the test vectors, error processing is performed as illustrated in detail in FIGS. 12a, b. After successful error processing, all the algorithms are tested again to ensure that no new errors have occurred due to the correction, but in principle testing could also be continued at the site of the instantaneously active algorithm.

Two methods are provided for error processing. FIG. 12a shows the generation of new multiplexer states by way of a counter, in which the variable v, v ∈ (0, 1, . . . (number of PAEs)) is the number of the defective PAE. If no PAE is defective, then v=0. First v is increased so that the next PAE beginning with PAE 1, is marked as defective. Then the test that was failed is carried out again. If the test runs correctly, it is certain that PAE v is defective and v is written into a non-volatile read-write memory (e.g., 0903). If the test is failed again, v is increased until either the test runs correctly or v reaches the position after the last PAE and it is thus proven that the defective group of PAEs cannot be corrected, either because the error is located somewhere else (e.g., the bus system) or two or more PAEs are defective.

Figure 12B:
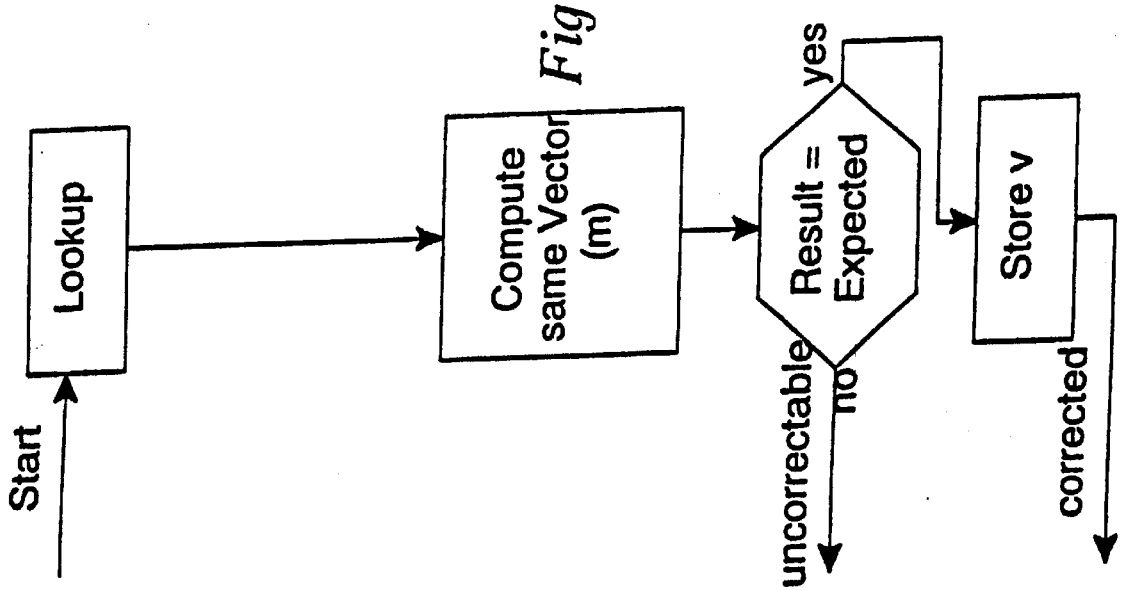
FIG. 12*b* shows a flowchart illustrating the generation of new multiplexer states using a look-up table according to the present invention.
Figure 12A:
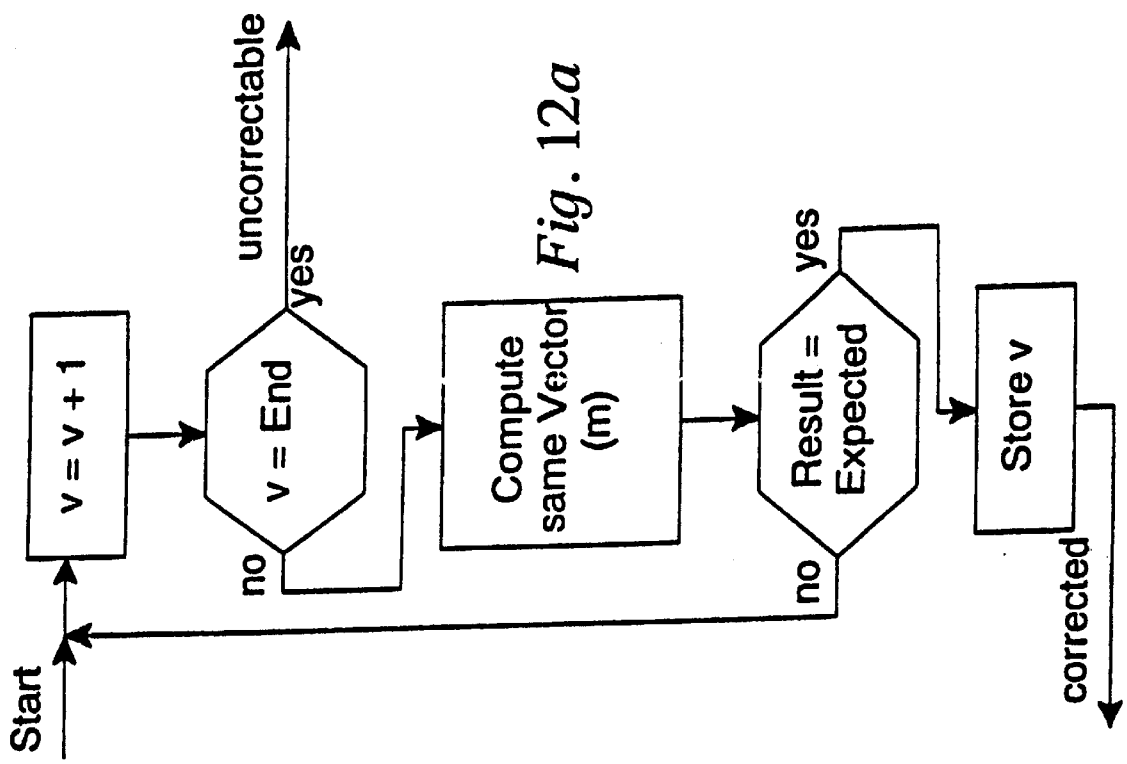
FIG. 12*a* shows a flowchart illustrating the generation of new multiplexer states using a counter according to the present invention.

FIG. 12b shows a less time-consuming option, where the look-up table described above is integrated. It receives as an input value indices m and n as well as the number of the comparator that found the error. This number is supplied by ErrorCHK (0706) over bus 0707. The look-up table supplies number v back to the defective PAE. Then the test that was failed is performed again. If the test runs correctly, it is certain that PAE v is defective and v is written into a non-volatile read-write memory (e.g., 0903). If the test is failed again, it is assumed that the error is irreparable. With most test algorithms, it is possible to determine the column of the defective PAE but not its row. Thus, the column of defective PAE v can be determined easily, but it is not known in which of the plurality of rows the defective PAE is located. Therefore, in such cases, the error processing of FIGS. 12a, b must be performed over all the rows that were involved in calculation of the test algorithm until the error has been detected or all the rows have been tested and the error is uncorrectable.

Figure 13:
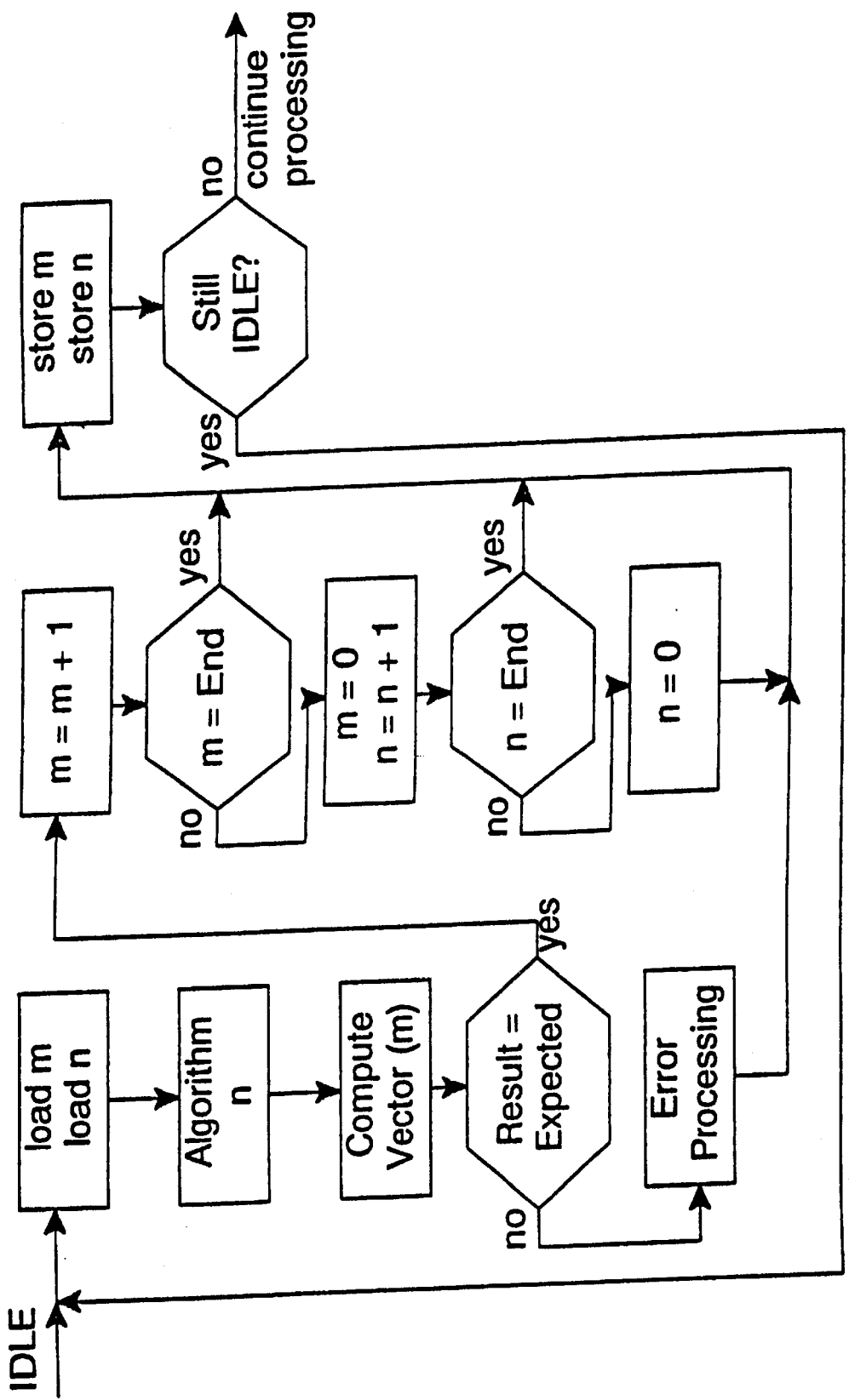
FIG. 13 shows a flowchart illustrating a self-test process during an IDLE cycle according to the present invention.

FIG. 13 shows a possibility of performing a chip test during IDLE cycles, i.e., cycles during which no program is being executed because the system is waiting for an action (e.g., a keyboard input). Such cycles are usually executed through queues in the program code. It is readily possible when such a waiting condition prevails to call up a test routine which performs a test of the chip during the waiting time, although a realtime capability is no longer possible in reaction to the action awaited. Indices m and n known from FIG. 11 are also used in FIG. 13 with the same meanings, but the indices are stored in the data memory. All the relevant data in the array is saved before calling up the test routine and is restored again after execution of the test routine. When the test routine is called up, the indices are first loaded from the data memory. Then the corresponding algorithm with the corresponding test vectors is executed. If the result is faulty, error processing is performed according to FIGS. 12a, b. Otherwise, the indices are calculated again and written back into the data memory. Then a test is performed to determine whether an IDLE state still prevails, i.e., if waiting for an action. If an IDLE state still prevails, the test routine is started again, but this time a different calculation is performed—according to the new calculation of indices already performed. If there is no longer an IDLE state, the program execution is continued in the normal way.

Figure 14:
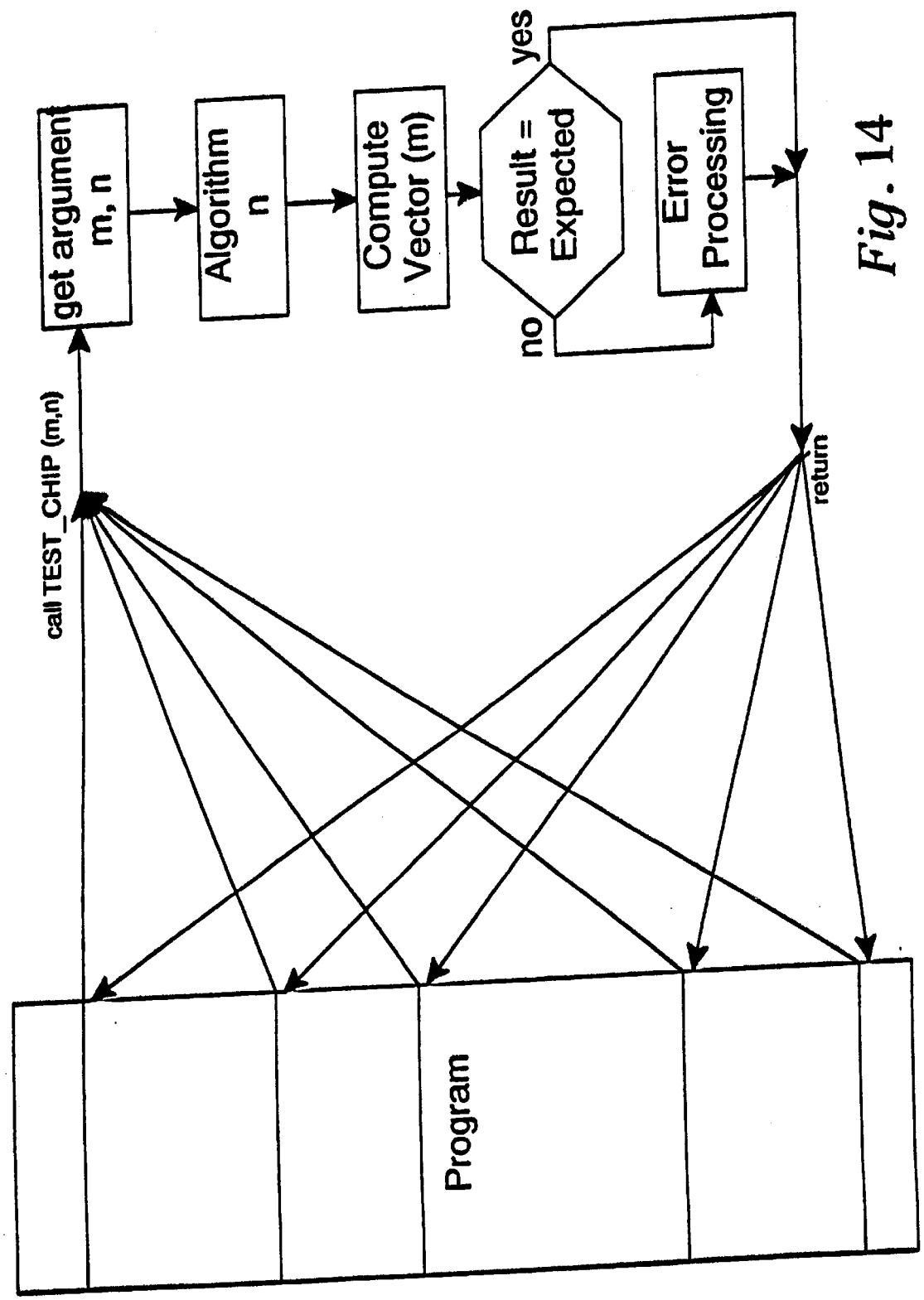
FIG. 14 illustrates a representation in which the self-test process is integrated into an application program according to the present invention.

FIG. 14 illustrates a possible modification of FIG. 13, where the test routine is called up directly by the application program (call TEST_CHIP(m, n)). The test routine is called up at certain suitable points in the algorithm. All the relevant data in the array is first saved and is restored again after execution of the test routine. Indices m, n are also transferred directly on call-up. Within the TEST_CHIP routine, algorithm n is executed with data m. The error test may be performed, for example, as illustrated in FIGS. 11 and 13. At the end of TEST_CHIP, the indices are not recalculated, in contrast with FIGS. 11 and 13. The return from the TEST_CHIP routine leads to the position directly downstream from "call TEST_CHIP," which is comparable to the BASIC standard GOSUB . . . RETURN.

Figure 15:
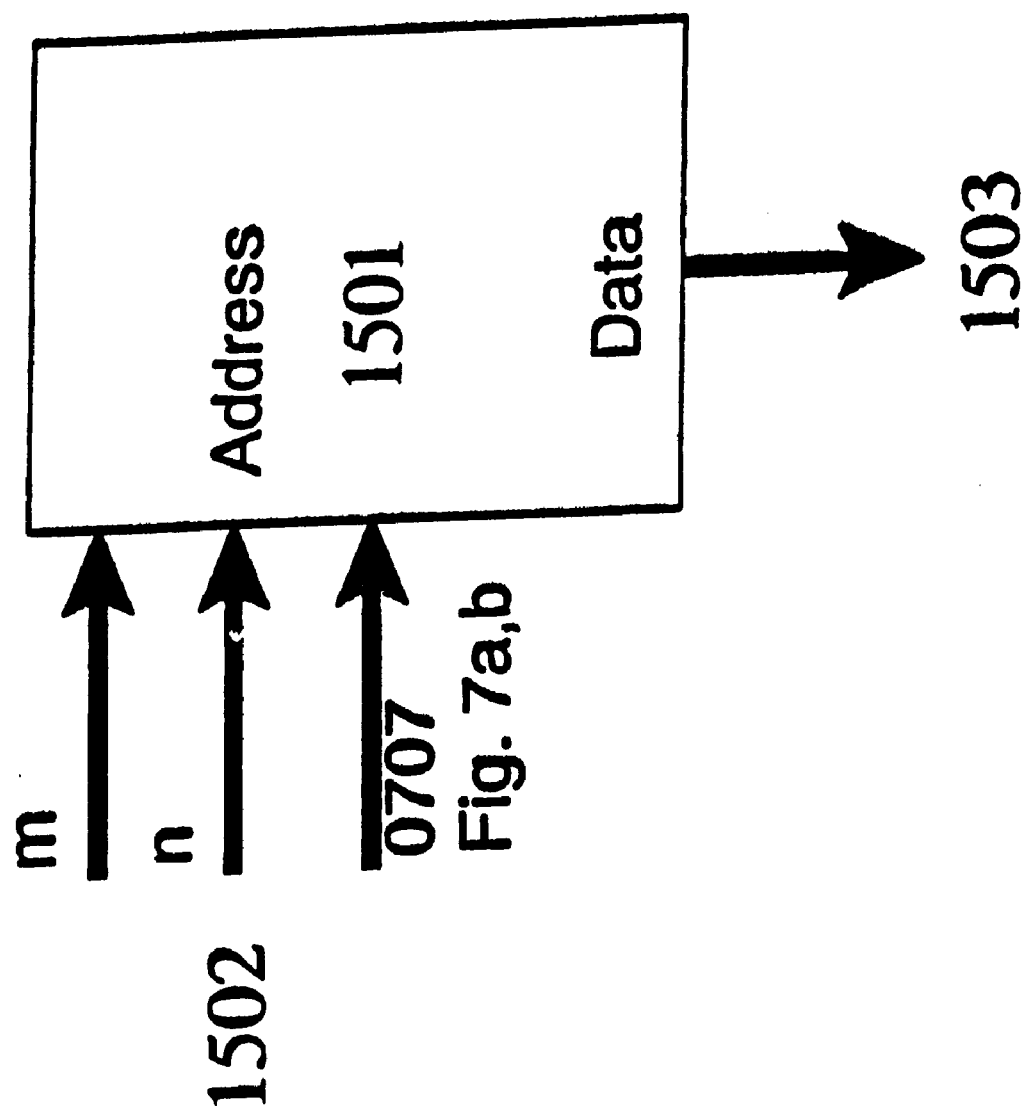
FIG. 15 illustrates a look-up table according to the present invention.

FIG. 15 illustrates a possible control of a look-up table. The look-up table (1501) implemented as a ROM, for example. Indices m, n, i.e., the identifier of the test algorithm performed instantaneously and the identifier of the current test data, as well as the result (0707) of the ErrorCHK unit (0706) are sent as addresses (1502) to the ROM. The resulting data (1503) indicates the number of the defective PAE. This number is transferred to the register (0108).

FIG. 16 shows a fault-tolerant bus system. An additional bus (1602) is assigned to a quantity of identical buses (1601). The bus system has terminals in all four directions. The terminals are connected to the buses over multiplexers (1603) so that if one bus fails, its function is assumed by the neighboring bus (below it in the horizontal or to the right in the vertical). All the multiplexers connected to a certain bus are addressed by the same control line, e.g., multiplexers 1603a which are connected to bus 1601a are controlled by control line 1604a. Control lines 1604 are controlled by a unit according to 0109 from FIG. 1. Further control and error processing are in principle the same as those described with regard to the preceding figures.

Figure 17:
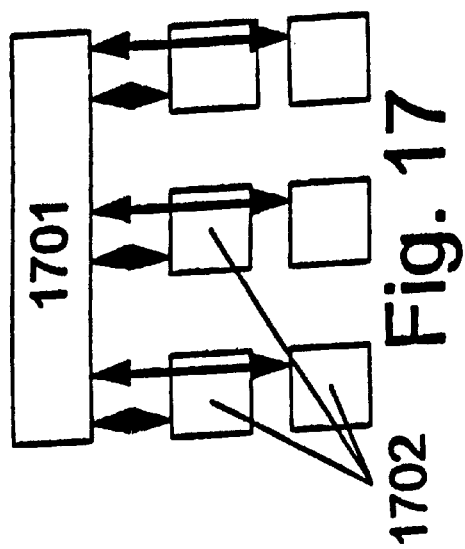
FIG. 17 illustrates saving registers in a chip-internal memory before executing a test algorithm according to the present invention.

FIG. 17 shows the assignment of a chip-internal RAM or RAM area (1701) to a group of cells (1702). Before executing the test algorithms, the internal registers of the cells (1702) are stored in the RAM or RAM area (1701). After execution of the test algorithms, the data is written back into the internal registers of the cells. The data is read and written over multiplexers/gates (0103, 0104 and 0105). Thus, data originating from a defective cell is written to the cell connected as a replacement according to the position of the multiplexers. The sequence of the user algorithm is not impaired by the test method.

Figure 18:
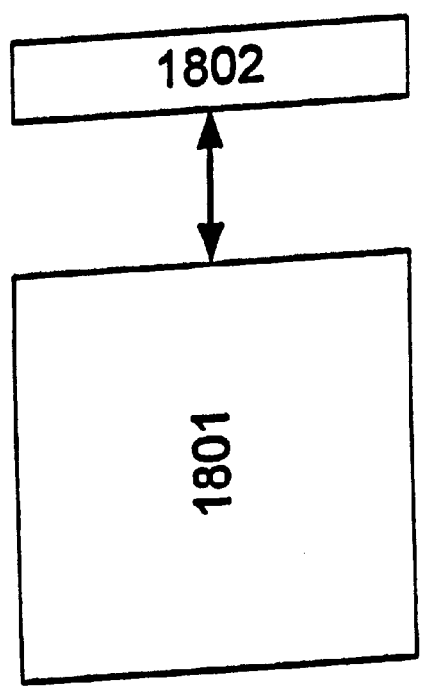
FIG. 18 illustrates saving registers in an external memory before executing the test algorithm according to the present invention.

FIG. 18 illustrates the system described in conjunction with FIG. 17, but the data of the cells in the chip (1801) is written to an external memory (1802) or read out of the external memory.

Figure 19:
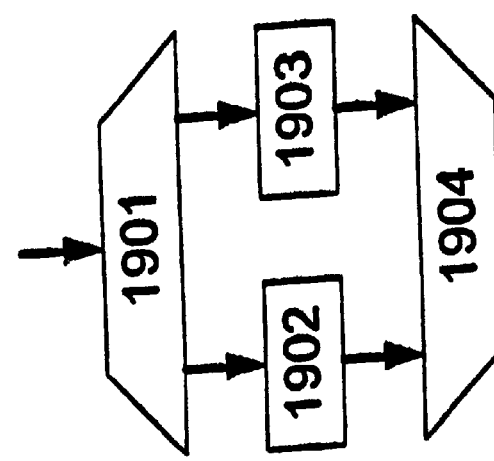
FIG. 19 illustrates a test register implementation before executing the test algorithm according to the present invention.

FIG. 19 illustrates the use of explicit test registers TestReg-n. A register TestReg-n (1903) used for the test algorithms is assigned to each internal register Reg-n of a cell (1902). The demultiplexers (the gate) (1901) selects which register is to be written to; the multiplexer (1904) select which register is to be read from. The control of the (de)multiplexers (1901, 1904) is such that in normal operation, i.e., while the user algorithms are running, Reg-n (1902) is selected and TestReg-n (1903) is used in execution of the test algorithm. The circuit according to FIG. 19 is implemented for each relevant register within a cell. A disadvantage of this circuit is that the data of a defective cell is not available to the cell connected as a replacement. To overcome this disadvantage, it is provided that an additional circuit based on the basic principle (0103, 0104 and 0105) according to the present invention be implemented by (de) multiplexers (1901, 1904). Thus, all the data can be made available to the replacement cell.

Definition of Terms

User algorithm: user-specific program that runs on the chip.

Output multiplexer: circuit comparable to a relay which selects between multiple possible buses at the outputs of PAEs.

BIST: built-in self-test. Self-test implemented in an integrated circuit, i.e., the TestMEM and all test functions are included in the circuit.

Booting: loading a basic program and setting the basic functions after a reset.

Bus: bundle of multiple individual signals/individual lines which together fulfil a certain transfer function (data bus, address bus . . . ).

EDST: external driven self-test. Self-test implemented in an integrated circuit where the TestMEM is connected outside the integrated circuit and parts of the control can also be accommodated outside the circuit.

Input multiplexer: circuit comparable to a relay which selects between multiple possible buses at the inputs of PAEs.

ErrorCHK: circuit implemented in an integrated unit which recognizes and localizes a fault during BIST or EDST.

HOST: a higher-order module or computer over an integrated circuit.

IDLE: state in which a processor or similar circuit waits for an action and does not perform any processing.

Look-up table: memory which returns a fixedly defined data word of any desired width on the basis of an address; usually implemented as a ROM or ROM-like memory.

Neighbor bus: bus located directly next to another bus and having the same structure.

PAE: processing array element according to German Patent Application No. 196 51 075.9-53. Although a PAE in German Patent Application No. 196 51 075.9-53 is an arithmetic and logic unit, the term is used in more general terms in the present patent to represent any desired cell, i.e., arithmetic and logic units, state machines, memories, etc.

PAER: cell which is additionally implemented on the integrated circuit and can be used as a replacement for a defective cell of the same design.

RESET: returning an integrated circuit to a defined basic state. A reset occurs in general after applying a voltage (turning the circuit on).

Self-test: automatic test method implemented in an integrated unit.

Setpoint results: the results that are supplied by the test algorithms to prove the correctness of the integrated circuit. There is an error if the setpoint results do not match the calculations.

Test algorithms: program that tests the integrated unit; it contains all the mathematical functions and circuits that are to be tested.

State machine: state machine for sequence control of complex operations; also called a sequencer.

Test algorithm: program for testing the chip or cells of a structure.

Test data: the quantity of all test algorithms, test vectors and setpoint results.

TestMEM: memory in which the test data is stored.

Test routine: individual program section within the test algorithms.

Test vectors: data with which the test algorithms are executed.

Gates: switches that relay or block data.

Cell: self-contained module within an integrated circuit, e.g., arithmetic and logic units, state machines, memories.

What is claimed is:

1. An integrated circuit arrangement, comprising:
   a plurality of modules, each of the modules having at least one input and at least one output, each of the modules forming at least one cell, the at least one cell including at least one of a bus system, an arithmetic and logic unit and a configurable logic cell;
   a supplementary module assigned to at least one of the modules;
   at least one input multiplexer coupled upstream to the inputs of the modules, each of the at least one input multiplexers configured to switch, in each case, an input signal between one a first one of the modules and a second one of the modules;
   at least one output multiplexer coupled downstream from the outputs of the modules, the at least one output multiplexer configured to switchably receive, in each case, an output signal of the first one of the modules and an output signal of the second one of the modules; and
   a control configured to control the at least one input multiplexer and the at least one output multiplexer to exclude a defective one of the modules, the control using a single decoder to perform at least one of (A) switching all of the at least one input multiplexer and the at least one output multiplexer in the same direction, and (B) switching all of the at least one input multiplexer and the at least one output multiplexer so that two groups of consecutive multiplexers are formed, multiplexers within each of the groups being switched in the same direction, the two groups being switched in different directions, the control performing the switching so that the defective one of the module is excluded.

2. The integrated circuit arrangement according to claim 1, wherein the error is detected via self-testing.

3. The integrated circuit arrangement according to claim 1, wherein the control is configured to decode a binary value so as to yield at least one of the first group and the second group.

4. The integrated circuit arrangement according to claim 1, wherein the control is configured to encode a binary value, the binary value defining at least one of a switching element group and a switching element circuit.

5. The integrated circuit arrangement according to claim 4, wherein the binary value is provided via a look-up-table arrangement.

6. The integrated circuit arrangement according to claim 1, further comprising:
   a memory that stores a binary value, the binary value indicating at least one of the defective module and all defective modules.

7. An integrated circuit arrangement, comprising:
   at least one module including one of an individual module and a plurality of ordered modules, each module of the at least one module having at least one input and at least one output, the at least one module forming at least one cell, the at least one cell including at least one of a bus system, an arithmetic and logic unit and a configurable logic cell;
   a supplementary module assigned to the at least one module and being of a same kind as the at least one module;
   a first switching element coupled to the at least one input of a particular module and being upstream from the at least one input of the particular module, the first switching element switching an input signal to at least one of the particular module and a module following the particular module; and
   a second switching element coupled to the at least one output of the particular module and being downstream from the at least one output of the particular module,
   wherein, if an error occurs in a module, then at least one of a defective module and a defective function cell is replaced by a module following the at least one of the defective module and the defective function cell by switching the first switching element and by switching the second switching element, a last module being replaced by the supplementary module, and wherein the binary value is generated by a counter.

8. An integrated circuit arrangement, comprising:
   at least one module including one of an individual module and a plurality of ordered modules, each module of the at least one module having at least one input and at least one output, the at least one module forming at least one cell, the at least one cell including at least one of a bus system, an arithmetic and logic unit and a configurable logic cell;
   a supplementary module assigned to the at least one module and being of a same kind as the at least one module;
   a first switching element coupled to the at least one input of a particular module and being upstream from the at least one input of the particular module, the first switching element switching an input signal to at least one of the particular module and a module following the particular module;
   a second switching element coupled to the at least one output of the particular module and being downstream from the at least one output of the particular module; and
   a memory that stores a binary value, the binary value indicating at least one of the defective module and all defective modules;
   wherein, if an error occurs in a module, then at least one of a defective module and a defective function cell is replaced by a module following the at least one of the defective module and the defective function cell by switching the first switching element and by switching the second switching element, a last module being replaced by the supplementary module, and wherein the memory that stores a binary value is independent of a system start.

9. A method for testing an integrated circuit having cells, comprising the steps of:
   testing a cell function of the integrated circuit by executing, with the cells, a test program including calculating test vectors;
   performing, with at least one of the cells wired as a comparator, a comparison between a test result and a setpoint result; and indicating an error if the comparison indicates a deviation between the setpoint result and the test result so that, in response to the error, a module having the cell found to be defective is replaced.

10. The method according to claim 9, wherein the step of testing the cell function includes the step of calling up test data from an integrated memory in the integrated circuit, the test data being used for executing the test program.

11. The method according to claim 9, wherein the method for testing the integrated circuit is carried out at a system start.

12. The method according to claim 9, wherein the method for testing the integrated circuit is carried out as a self-test method of application programs running during at least one of a wait cycle and an IDLE cycle.

13. The method according to claim 12, wherein the self-test method is at least one of called up from an application program and integrated into an application program.

14. The method according to claim 9, further comprising the steps of:

saving data from arithmetic and logic units to a chip-internal memory before running a test algorithm; and loading data back into the arithmetic and logic units after running the test algorithm.

15. The method according to claim 14, further comprising the steps of:

shutting down registers in the arithmetic and logic units before running the test algorithm;

using test registers for the test algorithms; and connecting the registers in the arithmetic and logic units after running the test algorithm.

16. The method according to claim 9, further comprising the steps of:

assigning at least one additional supplementary module to a number of ordered modules forming the cells, the at least one additional supplementary module and the ordered modules being of the same kind, each module having at least one input and at least one output;

coupling a first switching element to the at least one input of a particular module, the first switching element being disposed upstream from the at least one input of the particular module, the first switching element being configured to switch an input signal to one of the particular module and a module following the particular module;

coupling a second switching element to the at least one output of the particular module, the second switching element being disposed downstream from the at least one output of the particular module, the second switching element being configured to receive an output from one of the particular module and the module following the particular module; and if an error is detected in a module, then replacing a defective module by a module following the defective module by switching the first switching element and the second switching element, a last module in the ordered modules being replaced by the supplementary module.

17. A method for testing an integrated circuit having cells, comprising the steps of:

testing a cell function of the integrated circuit by executing, with the cells, a test program including calculating test vectors;

performing, with at least one of the cells, a comparison between a test result and a setpoint result; and indicating an error if the comparison indicates a deviation between the setpoint result and the test result so that, in response to the error, a module having the cell found to be defective is replaced;

wherein the step of testing the cell function includes the step of testing a cell array by at least one of exchanging and mirroring a test algorithm that includes a plurality of calculations at least once within the cell array.

* * * * *

UNITED STATES PATENT AND TRADEMARK OFFICE
CERTIFICATE OF CORRECTION

PATENT NO. : 6,697,979 B1
DATED : February 24, 2004
INVENTOR(S) : Vorbach et al.

It is certified that error appears in the above-identified patent and that said Letters Patent is hereby corrected as shown below:

Column 3,
Line 14, change "(n+3)..." to -- (n+3)=... --;
Line 15, change "...MUX" to -- ...=MUX --;

Column 5,
Line 65, change "a PAE is defective. One" to -- one PAE is defective. A --;

Column 6,
Line 5, change "ErrorCHK. The" to -- Error CHK, the --;
Line 15, change "maybe" to -- may be --;

Column 11,
Line 22, change "(1501) implemented" to -- (1501) is implemented --;

Column 12,
Line 6, change "by(de)" to -- by --;
Line 7, change "multiplexers" to -- (de)multiplexers --;

Signed and Sealed this

Fourth Day of January, 2005

JON W. DUDAS
*Director of the United States Patent and Trademark Office*